United States Patent
Bajaj et al.

(10) Patent No.: US 12,439,627 B2
(45) Date of Patent: Oct. 7, 2025

(54) GATE STRUCTURES TO ENABLE LOWER SUBTHRESHOLD SLOPE IN GALLIUM NITRIDE-BASED TRANSISTORS

(71) Applicant: Intel Corporation, Santa Clara, CA (US)

(72) Inventors: Sanyam Bajaj, Hillsboro, OR (US); Michael S. Beumer, Portland, OR (US); Robert Ehlert, Portland, OR (US); Gregory P. McNerney, Beaverton, OR (US); Nicholas Minutillo, Beaverton, OR (US); Xiaoye Qin, Beaverton, OR (US); Johann C. Rode, Hillsboro, OR (US); Atsunori Tanaka, Hillsboro, OR (US); Suresh Vishwanath, Portland, OR (US); Patrick M. Wallace, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 778 days.

(21) Appl. No.: 17/557,827

(22) Filed: Dec. 21, 2021

(65) Prior Publication Data
US 2023/0197840 A1    Jun. 22, 2023

(51) Int. Cl.
*H10D 30/47* (2025.01)
*H10D 30/01* (2025.01)
(Continued)

(52) U.S. Cl.
CPC ....... *H10D 30/4738* (2025.01); *H10D 30/015* (2025.01); *H10D 62/824* (2025.01); *H10D 62/8503* (2025.01); *H10D 64/411* (2025.01)

(58) Field of Classification Search
None
See application file for complete search history.

(56) References Cited

U.S. PATENT DOCUMENTS

| | | | |
|---|---|---|---|
| 2014/0266324 A1* | 9/2014 | Teo | H10D 62/8503 327/109 |
| 2015/0221727 A1* | 8/2015 | Kub | H10D 84/0119 257/77 |
| 2019/0221660 A1* | 7/2019 | Dasgupta | H10D 30/475 |

OTHER PUBLICATIONS

Bayram, C., et al. "Delta-Doping Optimization for High Quality p-Type GaN." Journal of Applied Physics, vol. 104, No. 8, Oct. 2008, p. 083512. aip.scitation.org (Atypon), https://doi.org/10.1063/1.3000564.

(Continued)

*Primary Examiner* — Khaja Ahmad
(74) *Attorney, Agent, or Firm* — Alliance IP, LLC

(57) ABSTRACT

In one embodiment, a transistor includes a substrate, a buffer layer on the substrate a channel layer on the buffer layer, and one or more polarization layers on the channel layer. The one or more polarization layers include a group III-N material comprising a first group III constituent and a second group III constituent. The transistor further includes a plurality of p-type doped layers on the one or more polarization layers. Each of the plurality of p-type doped layers includes a first p-type dopant and the III-N material, wherein each successive layer of the first p-type doped layers has a lower proportion of the first group III constituent to the second group III constituent relative to a layer below it. The transistor also includes a p-type doped layer on the plurality of p-type doped layers comprising a second p-type dopant and a group III-N material.

25 Claims, 11 Drawing Sheets

(51) Int. Cl.
    *H10D 62/824*    (2025.01)
    *H10D 62/85*     (2025.01)
    *H10D 64/27*     (2025.01)

(56) References Cited

OTHER PUBLICATIONS

Ke, Wen-Cheng, et al. "Influence of Mg-Containing Precursor Flow Rate on the Structural, Electrical and Mechanical Properties of Mg-Doped GaN Thin Films." Materials Chemistry and Physics, vol. 136, No. 2-3, 2012, pp. 796-801. www.academia.edu, https://www.academia.edu/33193268/Influence_of_Mg_containing_precursor_flow_rate_on_the_structural_electrical_and_mechanical_properties_of_Mg_doped_GaN_thin_films.

Nikishin, S., et al. "Digital Alloys of AlN/AlGaN for Deep UV Light Emitting Diodes." Undefined, Oct. 2005. www.semanticscholar.org, https://www.semanticscholar.org/paper/Digital-Alloys-of-AlN%2FAlGaN-for-Deep-UV-Light-Nikishin-Holtz/74813b0c03f0b4ead4051228d09385d77bd36494.

Yao-Bo, Pan, et al. "Improvement of Properties of P-GaN by Mg Delta Doping." Chinese Physics Letters, vol. 21, No. 10, Oct. 2004, pp. 2016-2018. DOI.org (Crossref), https://doi.org/10.1088/0256-307X/21/10/042.

Zhao, Ying, et al. "Enhanced P-Type GaN Conductivity by Mg Delta Doped AlGaN/GaN Superlattice Structure." Materials, vol. 14, No. 1, Jan. 2021, p. 144. www.mdpi.com, https://doi.org/10.3390/ma14010144.

* cited by examiner

GATE STRUCTURES TO ENABLE LOWER SUBTHRESHOLD SLOPE IN GALLIUM NITRIDE-BASED TRANSISTORS

BACKGROUND

Gallium nitride (GaN) is a group III-V semiconductor that has several advantages over silicon (Si). For example, GaN has a direct and wide band gap, high breakdown field, high electron mobility, thermal stability (e.g., a high melting point), and the ability to form a high-mobility two-dimensional electron gas (2 DEG) when deposited on another III-V semiconductor. As a result, GaN transistors are particularly beneficial for high-power and high-frequency electronic devices that operate at high temperatures.

DETAILED DESCRIPTION

Figure 1:
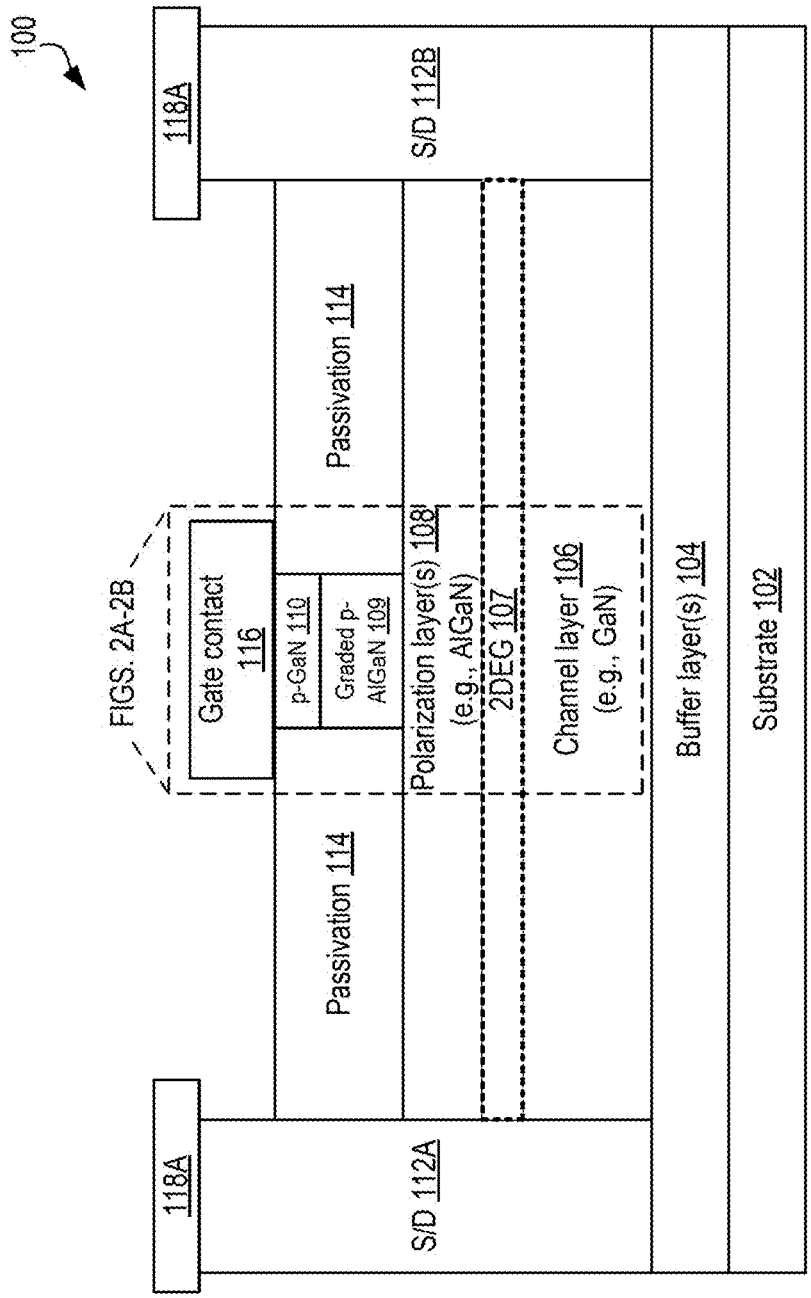
FIG. 1 illustrates an example GaN-based high-electron-mobility transistor (HEMT) device with a graded gate structure in accordance with embodiments of the present disclosure.

Gallium nitride (GaN) is a group III-V semiconductor that has several advantages over silicon (Si). For example, GaN has a direct and wide band gap, high breakdown field, high electron mobility, thermal stability (e.g., a high melting point), and the ability to form a high-mobility two-dimensional electron gas (2 DEG) when deposited on another III-V semiconductor. As a result, GaN transistors are particularly beneficial for high-power and high-frequency electronic devices that operate at high temperatures.

In some instances, Magnesium (Mg)-doped GaN may be used as a gate contact to enable enhancement mode ("e-mode") operation in GaN-based high-electron-mobility transistor (HEMT) devices. The Mg-doped layer may form a p-type doped GaN layer, or "p-GaN" layer. However, current devices can suffer from high subthreshold slope.

Previous approaches to this have involved delta-doped p-GaN (e.g., GaN/p-GaN laminations). However, delta doping provides a lower average carrier concentration when compared with a single layer p-GaN structure, which requires either a thicker p-GaN layer or higher dopant concentration to get the threshold voltage (VT) on target. Also, delta doping needs to be done on u-GaN (unintentionally doped GaN, which may also be referred to herein as just GaN) as a u-GaN/Mg/u-GaN superlattice; if done on p-GaN as p-GaN/Mg/p-GaN, the p-GaN film decomposes during delta doping step due to higher propensity of p-GaN to dissociate. Therefore, all of Mg in delta doped p-GaN needs to be incorporated in thin regions between u-GaN that could result in Mg clustering issues. Delta doping may also be hard to check using in-line metrology, making it difficult to match across tools in a HVM environment.

Another approach has involved continuously graded doping (e.g., a lower Mg dopant concentration near the polarization layer and a higher Mg dopant concentration near the gate contact). However, this is difficult to control in fabrication and can result in significant variation from wafer to wafer.

Accordingly, aspects of the present disclosure describe novel gate structures for GaN-based transistor devices that can improve/lower the subthreshold slope and provide one or more other advantages over current techniques. In some embodiments, for example, the gate structure may include a graded Mg-doped AlGaN approach where the Al concentration is graded (either stepwise or continuously) between the polarization layer and the gate metal contact. The p-doped AlGaN (p-AlGaN) gates have demonstrated significantly reduced subthreshold slope when compared with standard p-GaN gates. A gate structure with graded p-AlGaN can provide a straightforward and consistent solution to the high subthreshold slope problem. For instance, by using a graded p-AlGaN gate, the subthreshold slope can be reduced without impacting other critical device metrics such as drive and VT.

In other embodiments, the gate structure may include a "digital doped" structure (e.g., a superlattice) of alternating p-GaN and GaN layers. Gate structures with digital doped layers can provide a less defective overall p-GaN layer resulting in a lower sub-threshold slope (SS) for the e-mode transistor devices. Further, a digital doped gate structure can result in films that are less rough than continuously doped gate structures. Embodiments may implement either t-gate or I-gate configurations.

FIG. 1 illustrates an example GaN-based high-electron-mobility transistor (HEMT) device 100 with a graded gate structure in accordance with embodiments of the present disclosure. The example HEMT device 100 may include additional, fewer, or different components or layers than those shown. Further, it will be understood that the HEMT device 100 shown in FIG. 1 is not necessarily drawn to scale, and proportions of the various layers/components shown may differ from that shown in FIG. 1.

The example HEMT device 100 includes a substrate 102, one or more buffer layers 104 on the substrate, a channel layer 106 on the buffer layers 104, one or more polarization layers 108 on the channel layer 106, graded p-AlGaN layers 109 on the polarization layers 108, a p-GaN layer 110 on the graded p-AlGaN layers 109, and source/drain regions 112 on either side of the channel and polarization layers. In addition, there is a passivation layer 114 on the polarization layer 108, around/surrounding the graded p-AlGaN layers 109 and p-GaN layer 110, as well as a gate contact 116 on the passivation layer 114 and in contact with the p-GaN layer 110 and source/drain contacts 118 on the source/drain regions 112. Between the channel and polarization layers, there is a two-dimensional electron gas (2 DEG) 107 that is formed.

The substrate 102 may be a silicon substrate in certain embodiments, or another suitable substrate material. The buffer layers 104 may include one or more layers of a group III-nitride (III-N) material, such as aluminum gallium nitride (AlGaN). The channel layer 106 may also include a III-N material, such as gallium nitride (GaN). In this manner, the AlGaN buffer layers 104 between the GaN channel layer 106 and the Si substrate 102 may serve as a buffer separating those layers.

The source/drain regions 112 are formed on opposite ends of the channel layer 106 such that they are coupled together via the channel layer 106. Moreover, the source/drain regions 112 may be formed from a III-N material, such as indium gallium nitride (e.g., N+ $In_xGa_{1-x}N$, where x is between 0 and 0.3 and the dopant is Si) in certain embodiments. The source/drain contacts 118 may be formed on or above—and in contact with—the respective source and drain regions 112. The source and drain contacts 118 may include an electrically conductive material, such as a metal.

Figure 2A:
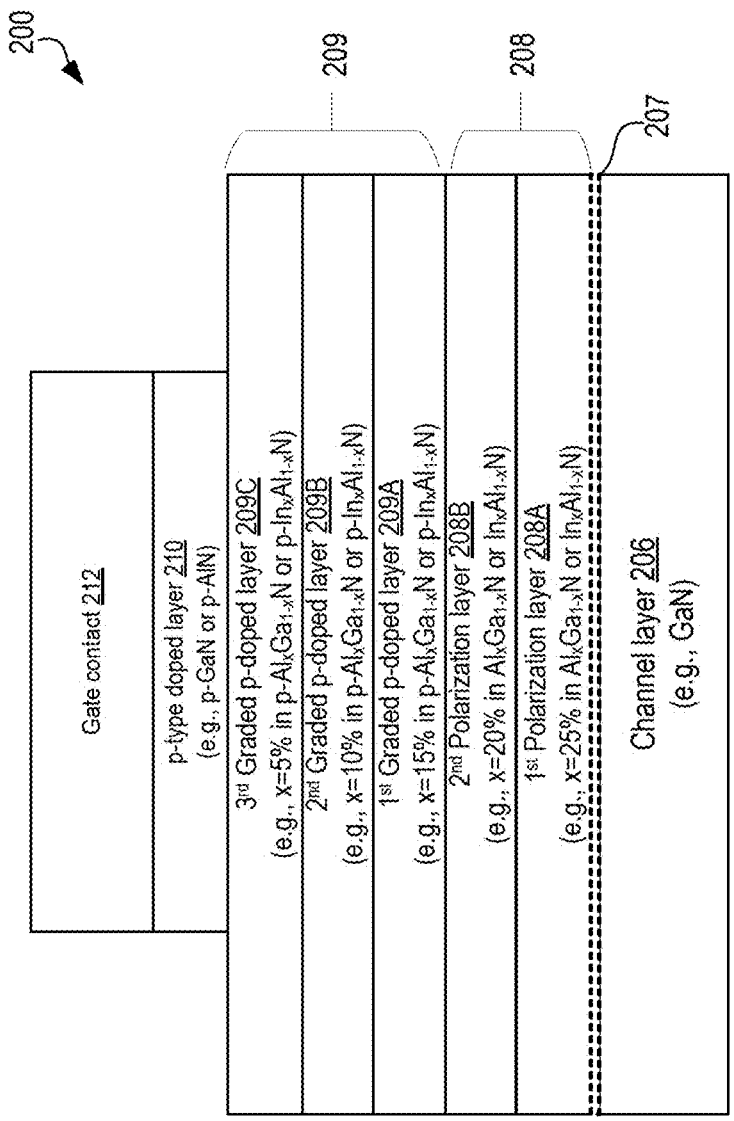
FIGS. 2A-2B illustrate example graded gate stack configurations for the GaN-based high-electron-mobility transistor (HEMT) device 100 of FIG. 1 in accordance with embodiments of the present disclosure.
Figure 2B:
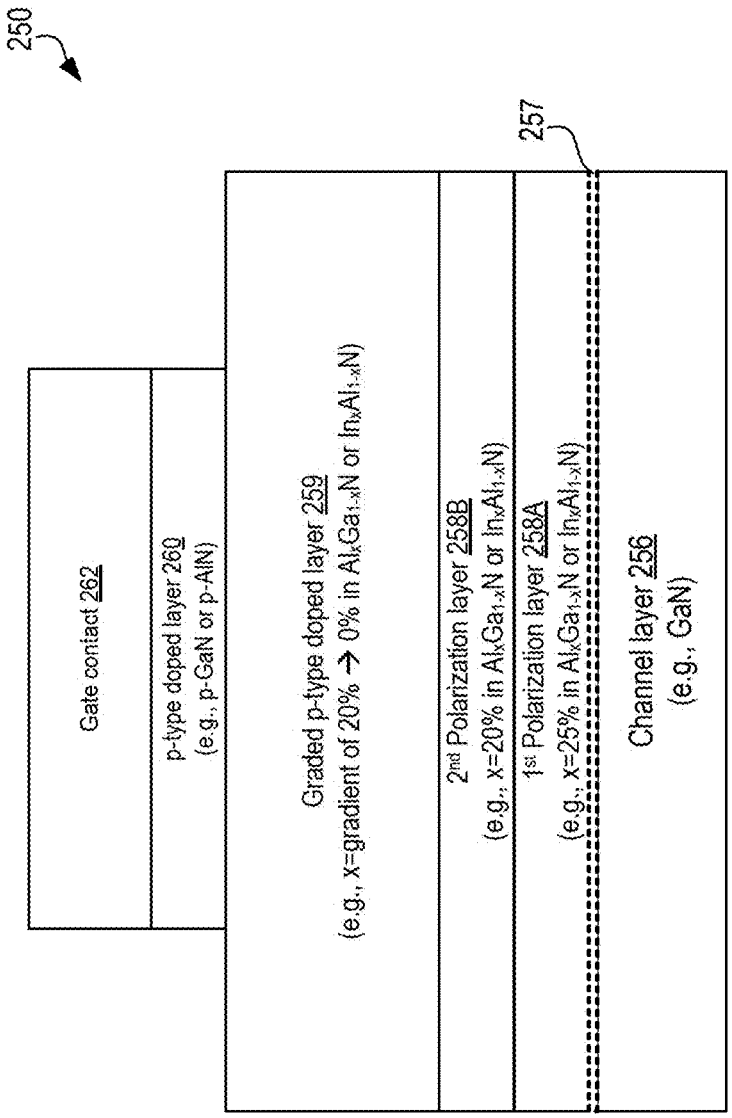

The polarization layer(s) 108 include one or more layers of a III-N material that includes two group III constituents, such as aluminum gallium nitride (AlGaN) or indium aluminum nitride (InAlN). The polarization layer(s) 108 may induce the formation of the two-dimensional electron gas (2 DEG) 107. For example, when a AlGaN polarization layer 108 is formed on the GaN channel layer 106, the 2 DEG 107 forms at or near the interface of the channel layer 106 and the polarization layer(s) 108. In some embodiments, the polarization layer(s) 108 may include multiple layers, with each successive layer including a lower proportion x in $Al_xGa_{1-x}N$ or $In_xAl_{1-x}N$ (or generally $A_xB_{1-x}N$ for other III-N materials with other group III constituents, where A refers to a minor group III constituent (e.g., Al in AlGaN) and B refers to a major group III constituent (e.g., Ga in AlGaN)). Any suitable number of polarization layers 108 may be implemented, e.g., two as shown in FIGS. 2A-2B.

In some embodiments, the total thickness of the polarization layer(s) 108 may be between 2-20 nm, e.g., 8 nm. Where there are two polarization layers 108, each layer may make up any suitable portion of the total thickness of the polarization layer(s) 108, e.g., between 1-10 nm each. For example, in some embodiments, the polarization layer(s) 108 may include two layers of equal thickness, e.g., 4 nm each. In other embodiments, the polarization layer(s) 108 may include two layers of unequal thickness, e.g., 2 nm and 6 nm.

In some embodiments, the graded p-AlGaN layer(s) 109 may include multiple layers of a III-N material (e.g., aluminum gallium nitride (AlGaN) or indium aluminum nitride (InAlN)) that each include p-type dopants (e.g., magnesium (Mg)). Each successive layer including a lower proportion x in $Al_xGa_{1-x}N$ or $In_xAl_{1-x}N$. However, each layer may contain the same concentration of the p-type dopants. In some embodiments, the bottom layer of the graded p-AlGaN layers 109 may have a proportion x in $Al_xGa_{1-x}N$ or $In_xAl_{1-x}N$ that is lower than the top polarization layer 108. For example, where the top polarization layer 108 has a proportion x=20% in $Al_xGa_{1-x}N$ or $In_xAl_{1-x}N$, the bottom layer of the graded p-AlGaN layers 109 may have a proportion x<20% (e.g., x=15%) in $Al_xGa_{1-x}N$ or $In_xAl_{1-x}N$.

In other embodiments, the graded p-AlGaN layers 109 may include a single layer in which the proportion x in $Al_xGa_{1-x}N$ or $In_xAl_{1-x}N$ is continuously graded throughout the layer. For example, where the top polarization layer 108 has a proportion x=20% in $Al_xGa_{1-x}N$ or $In_xAl_{1-x}N$, the bottom most portion of the single graded p-AlGaN layer 109 may have a proportion x=20% in $Al_xGa_{1-x}N$ or $In_xAl_{1-x}N$ and the proportion x may continuously through the thickness of the layer such that the top most portion of the single graded p-AlGaN layer 109 has a proportion x<20% in $Al_xGa_{1-x}N$ or $In_xAl_{1-x}N$ (e.g., x=0-5%).

In some embodiments, each layer of the graded p-AlGaN layer(s) 109 may be between 1-10 nm in thickness, with the total thickness of the graded p-AlGaN layer(s) 109 may be between 3-25 nm, e.g., 9-10 nm. For example, in some embodiments, the graded p-AlGaN layers 109 may include three layers each with equal thickness, e.g., between 1-5 nm (e.g., 3 nm each). In other embodiments, there may be a single graded p-AlGaN layer 109 with a continuous gradient in the proportion x in $Al_xGa_{1-x}N$ or $In_xAl_{1-x}N$, and the overall thickness of the layer 109 may be between 5-20 nm.

The p-GaN layer 110 on the graded p-AlGaN layer(s) 109 may include a III-N material (e.g., gallium nitride (GaN) or aluminum nitride (AlN)) and p-type dopants (e.g., magnesium). The p-GaN layer 110 may deplete the 2 DEG 107, causing the HEMT device 100 to function as an enhancement mode (e-mode) device rather than a depletion mode (d-mode) device. The gate structure may include a p-AlGaN layer at 110 instead of a p-GaN layer.

The gate contact 116 may be formed on or above—and in contact with—the the p-GaN layer 110, and may include an electrically conductive material, such as a metal. The passivation layer 114 is formed on or above the polarization layer 108 and around the p-GaN layer 110. The passivation layer 114 may include a dielectric material such as silicon dioxide ($SiO_2$) or silicon nitride (SiN) and may passivate the surface of the polarization layer 108 (e.g., to protect it from contamination).

FIGS. 2A-2B illustrate example graded gate stack configurations 200, 250 for the GaN-based high-electron-mobility transistor (HEMT) device 100 of FIG. 1 in accordance with embodiments of the present disclosure. The example configuration 200 shown in FIG. 2A includes multiple graded p-AlGaN layers 209, while the example configuration 250 of FIG. 2B includes a single p-AlGaN layer 209 with a gradient of the proportion x in $Al_xGa_{1-x}N$ or $In_xAl_{1-x}N$ through the layer 209. It will be understood that the example configurations shown in FIGS. 2A-2B are not necessarily drawn to scale, and that proportions of the various layers/components shown may differ from that shown. Further, although certain example proportions of x in $Al_xGa_{1-x}N$ or $In_xAl_{1-x}N$ are shown for the various layers, the proportions may differ from the examples shown. Additionally, although a certain number of example polarization layers 208 and/or graded p-doped layers 209 are shown in FIGS. 2A-2B, the number of layers in 208, 209 may be different in various embodiments.

Referring to FIG. 2A, the example gate stack configuration 200 includes a channel layer 206 (which may be implemented in the same or similar manner as the channel layer 106 of FIG. 1), a first polarization layer 208A on the channel layer (with a 2 DEG 207 formed between the layers 206, 208A), a second polarization layer 208B on the first polarization layer, a first graded p-type doped layer 209A on the second polarization layer 208B, a second graded p-type doped layer 209B on the first graded p-type doped layer 209A, a third graded p-type doped layer 209C on the second graded p-type doped layer 209B, another p-type doped layer 210 (which may be implemented in the same or similar manner as the p-GaN layer 110 of FIG. 1) on the third graded p-type doped layer 209C, and a gate contact 212 (which may be implemented in the same or similar manner as the gate contact 116 of FIG. 1) on the p-type doped layer 210. The p-type doped layer 210 may include a III-N material with a single group III constituent, such as GaN or AN.

The first polarization layer 208A includes a III-N material with two group III constituents, such as AlGaN or InAlN with a first proportion $x_1$ in $Al_xGa_{1-x}N$ or $In_xAl_{1-x}N$. The second polarization layer 208B includes a III-N material such as AlGaN or InAlN with a second proportion $x_2$ in $Al_xGa_{1-x}N$ or $In_xAl_{1-x}N$, where $x_2 < x_1$. The first graded p-type doped layer 209A includes a III-N material such as AlGaN or InAlN with p-type dopants (e.g., Mg) with a third proportion $x_3$ in $Al_xGa_{1-x}N$ or $In_xAl_{1-x}N$, where $x_3 < x_2$. The second graded p-type doped layer 209B also includes a III-N material such as AlGaN or InAlN with p-type dopants (e.g., Mg) with a fourth proportion $x_4$ in $Al_xGa_{1-x}N$ or $In_xAl_{1-x}N$, where $x_4 < x_3$. The third graded p-type doped layer 209C includes a III-N material such as AlGaN or InAlN with p-type dopants (e.g., Mg) with a fifth proportion $x_5$ in $Al_xGa_{1-x}N$ or $In_xAl_{1-x}N$, where $x_5 < x_4$. In some embodiments $x_1 = 25\%$, $x_2 = 20\%$, $x_3 = 15\%$, $x_4 = 10\%$, and $x_5 = 5\%$.

Although 3 graded p-type doped layers are shown in FIG. 2A, embodiments may include anywhere between 2-12 (or more) p-type doped layers 209, with the compositional range of x in $Al_xGa_{1-x}N$ or $In_xAl_{1-x}N$ being anywhere between 10 and 50%. In each layer, the Mg dopant flux may be kept constant, and can range from $1 \times 10^{18}$ cm$^{-3}$ to $1 \times 10^{20}$ cm$^{-3}$ as measured by SIMS.

Referring to FIG. 2B, the example gate stack configuration 250 includes a channel layer 256 (which may be implemented in the same or similar manner as the channel layer 106 of FIG. 1), a first polarization layer 258A on the channel layer (with a 2 DEG 257 formed between the layers 256, 258A), a second polarization layer 258B on the first polarization layer, a single graded p-type doped layer 259 on the second polarization layer 258B, a p-GaN layer 260 (which may be implemented in the same or similar manner as the p-GaN layer 110 of FIG. 1) on the graded p-type doped layer 259, and a gate contact 262 (which may be implemented in the same or similar manner as the gate contact 116 of FIG. 1) on the p-GaN layer 260.

The first polarization layer 258A includes a III-N material such as AlGaN or InAlN with a first proportion $x_1$ in $Al_xGa_{1-x}N$ or $In_xAl_{1-x}N$. The second polarization layer 258B includes a III-N material such as AlGaN or InAlN with a second proportion $x_2$ in $Al_xGa_{1-x}N$ or $In_xAl_{1-x}N$, where $x_2 < x_1$. The graded p-type doped layer 259 includes a III-N material such as AlGaN or InAlN with p-type dopants (e.g., Mg) with a gradient proportion $x_3$ in $Al_xGa_{1-x}N$ or $In_xAl_{1-x}N$, where $x_3$ begins at the bottom of the layer as $x <= x_2$ and reduces in a continuous gradient up through the layer. In some embodiments, $x_1 = 25\%$, $x_{2=20}\%$, and $x_3$ begins at ~20% at the bottom of the layer 259 and reduces in a continuous gradient to ~0% at the top of the layer 259.

Figure 3:
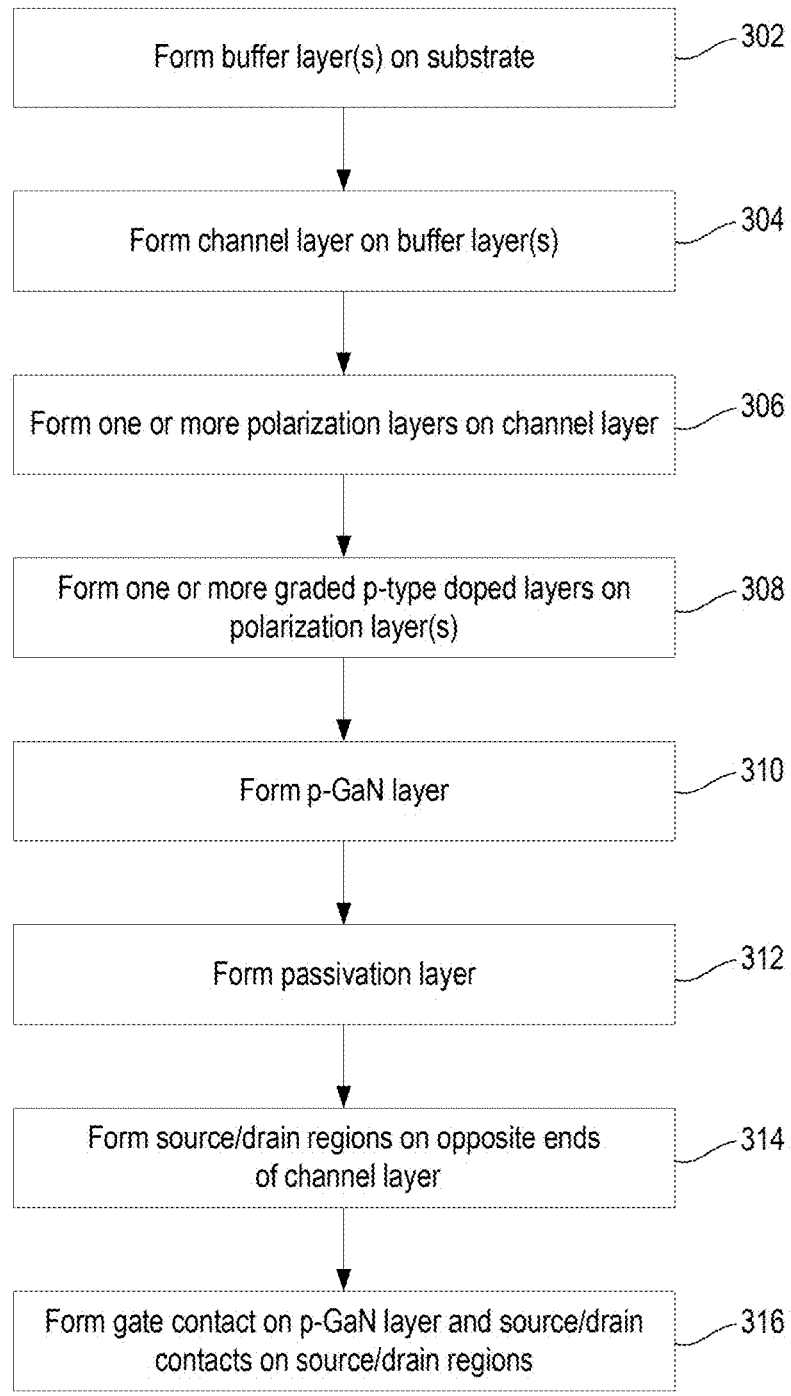
FIG. 3 illustrates a flow diagram of an example process for fabricating a GaN-based high-electron-mobility transistor (HEMT) device with a graded gate structure in accordance with embodiments of the present disclosure

FIG. 3 illustrates a flow diagram of an example process 300 for fabricating a GaN-based high-electron-mobility transistor (HEMT) device with a graded gate structure (e.g., device 100 of FIG. 1 with stack configurations 200, 250 of FIGS. 2A-2B) in accordance with embodiments of the present disclosure. The operations of the process 300 may be performed using any suitable semiconductor fabrication techniques. For example, where not otherwise mentioned below, film deposition—such as depositing layers, filling portions of layers (e.g., removed portions), and filling via openings—may be performed using any suitable deposition techniques, including, for example, chemical vapor deposition (CVD), metalorganic chemical vapor deposition (MOCVD), molecular beam epitaxy (MBE) atomic layer deposition (ALD), and/or physical vapor deposition (PVD). Moreover, patterning and removal—such as interconnect patterning, forming via openings, and shaping—may be performed using any suitable techniques, such as lithography-based patterning/masking and/or etching. Furthermore, additional, fewer, or other operations may be incorporated into the process 300 to fabricate a GaN-based HEMT device in accordance with embodiments of the present disclosure.

At 302, one or more buffer layers (e.g., 104) are formed on a substrate (e.g., 102). In some embodiments, the substrate may be formed from a material that includes silicon (Si), and the buffer layer may be formed from a group III-nitride (III-N) material. The III-N material may include aluminum (Al), gallium (Ga), and/or nitrogen (N), such as aluminum gallium nitride (AlGaN), among other examples.

At 304, a channel layer (e.g., 106, 206, 256) is formed on the buffer layers. In some embodiments, the channel layer may be formed from a III-N material. The III-N material may include gallium (Ga) and/or nitrogen (N), such as gallium nitride (GaN), among other examples.

At 306, one or more polarization layers (e.g., 108, 208, 258) are formed on the channel layer. In some embodiments, the polarization layer may be formed from a III-N material. The III-N material may include aluminum (Al), gallium (Ga), indium (In), and/or nitrogen (N), such as aluminum gallium nitride (AlGaN) or indium aluminum nitride (InAlN), among other examples. The formation of the polarization layer(s) on the channel layer may form a two-dimensional electron gas (2 DEG) (e.g., 107) at or near the interface of the channel layer and the polarization layer. The polarization layer(s) may be formed, in certain embodiments, using chemical vapor deposition techniques (e.g., MOCVD). In certain embodiments, multiple polarization layers may be formed, e.g., as shown in FIGS. 2A-2B, with each successive layer having a lower proportion of x in in $Al_xGa_{1-x}N$ or $In_xAl_{1-x}N$. Thus, each layer may be formed under the same conditions, with the exception of the lowering of the flow rate for the Al in AlGaN layers or In in InAlN layers for each successive layer.

At 308, one or more graded p-type doped layers (e.g., 209, 259) are formed on the polarization layer(s). In some embodiments, the polarization layer may be formed from a III-N material with p-type dopants. The III-N material may include aluminum (Al), gallium (Ga), indium (In), and/or nitrogen (N), such as aluminum gallium nitride (AlGaN) or indium aluminum nitride (InAlN), among other examples. The p-type dopants may include magnesium (Mg) or beryllium (Be), among other examples. In some embodiments, multiple p-type doped layers may be formed with each successive layer having a lower proportion of x in the p-$Al_xGa_{1-x}N$ or p-$In_xAl_{1-x}N$, e.g., as in FIG. 2A. In such cases, each layer may be formed under the same conditions (e.g., the p-type dopant flux may be kept constant for the formation of each layer at 308 and can range from $1 \times 10^{18}$ cm$^{-3}$ to $1 \times 10^{20}$ cm$^{-3}$ as measured by SIMS), with the exception of the lowering of the flow rate for the Al in p-AlGaN layers or In in p-InAlN layers for each successive layer. In other embodiments, a single p-type doped layer may be formed with a continuous (lowering) gradient of the proportion of x in the p-$Al_xGa_{1-x}N$ or p-$In_xAl_{1-x}N$, e.g., as in FIG. 2B. Thus, the layer may be formed by continuously lowering the flow rate of Al in a p-AlGaN layer or In in a p-InAlN layer as the layer is formed.

At 310, a p-GaN layer (e.g., 110) is formed on the graded p-type doped layer(s). The p-GaN layer may be formed, in certain embodiments, using chemical vapor deposition techniques (e.g., MOCVD).

At 312, a passivation layer (e.g., 114) is formed on the polarization layer. In some embodiments, the passivation layer may be formed from a material that includes silicon (Si), oxygen (O), and/or nitrogen (N), such as silicon dioxide ($SiO_2$) or silicon nitride (SiN), among other examples.

At 314, source/drain regions (e.g., 112) are formed on opposite ends of the channel layer. For example, a first source/drain region may be formed adjacent to one end of the channel layer, and a second source/drain region may be formed adjacent to another (e.g., opposite) end of the channel layer (e.g., as shown in FIG. 1) to couple the respective source/drain regions via the channel layer. In some embodiments, the source/drain regions may be formed from a material that includes indium (In), gallium (Ga), and/or nitrogen (N), such as indium gallium nitride (e.g., N+ $In_xGa_{1-x}N$, where x is between 0 and 0.3 and the dopant is Si), among other examples.

At 316, a gate contact (e.g., 116) is formed on the p-GaN layer and source/drain contacts (e.g., 118) are formed on the source/drain regions. In some embodiments, the gate contact and source/drain contacts may be formed from an electrically conductive material such as a metal.

Figure 4A:
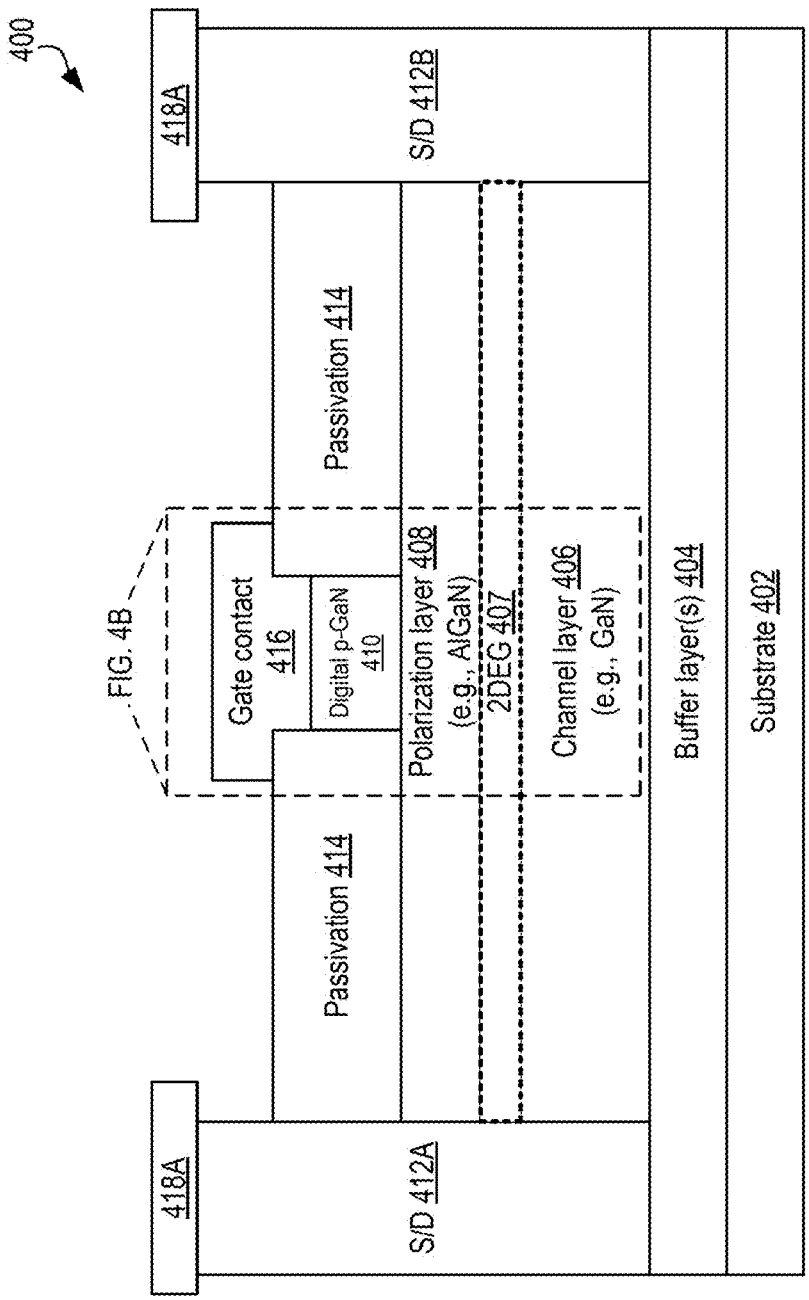
FIGS. 4A-4B illustrate an example GaN-based high-electron-mobility transistor (HEMT) device with a digital doped p-GaN gate structure in accordance with embodiments of the present disclosure.
Figure 4B:
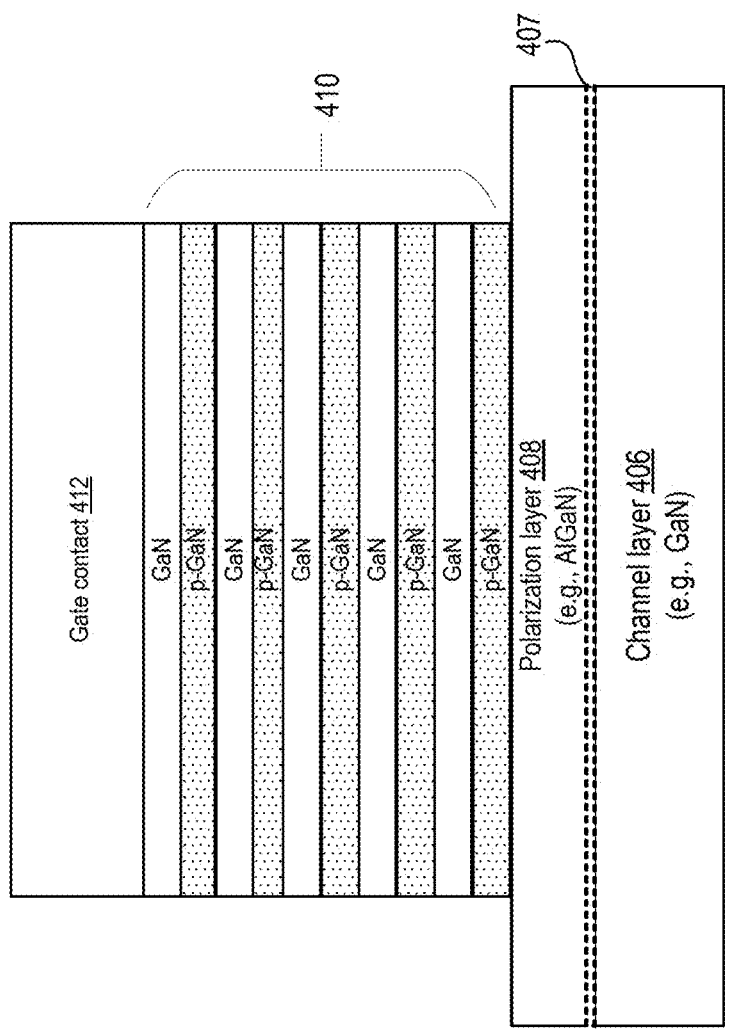

FIGS. 4A-4B illustrate an example GaN-based high-electron-mobility transistor (HEMT) device 400 with a digital doped p-GaN gate structure in accordance with embodiments of the present disclosure. The example HEMT device 400 may include additional, fewer, or different components or layers than those shown. Further, it will be understood that the HEMT device 400 shown in FIGS. 4A-4B is not necessarily drawn to scale, and proportions of the various layers/components shown may differ from that shown.

The example HEMT device 400 includes a substrate 402, one or more buffer layers 404 on the substrate, a channel layer 406 on the buffer layers 404, a polarization layer 408 on the channel layer 406, a digital p-type doped layer 410 (e.g., p-GaN) on the polarization layer 408, and source/drain regions 412 on either side of the channel and polarization layers. In addition, there is a passivation layer 414 on the polarization layer 408, around/surrounding the digital p-type doped layer 410, as well as a gate contact 416 on the passivation layer 414 and in contact with the digital p-type doped layer 410 and source/drain contacts 418 on the source/drain regions 412. Between the channel and polarization layers, there is a two-dimensional electron gas (2 DEG) 407 that is formed.

The substrate 402 may be a silicon substrate in certain embodiments, or another suitable substrate material. The buffer layers 404 may include one or more layers of a group III-nitride (III-N) material, such as aluminum gallium nitride (AlGaN). The channel layer 406 may also include a III-N material, such as gallium nitride (GaN). In this manner, the AlGaN buffer layers 404 between the GaN channel layer 406 and the Si substrate 402 may serve as a buffer separating those layers.

The source/drain regions 412 are formed on opposite ends of the channel layer 406 such that they are coupled together via the channel layer 406. Moreover, the source/drain regions 412 may be formed from a III-N material, such as indium gallium nitride (e.g., N+ $In_xGa_{1-x}N$, where x is between 0 and 0.3 and the dopant is Si) in certain embodiments. The source/drain contacts 418 may be formed on or above—and in contact with—the respective source and drain regions 412. The source and drain contacts 418 may include an electrically conductive material, such as a metal.

The polarization layer 408 may include a III-N material, such as aluminum gallium nitride (AlGaN). The polarization layer 408 may induce the formation of the two-dimensional electron gas (2 DEG) 407. For example, when the AlGaN polarization layer 408 is formed on the GaN channel layer 406, the 2 DEG 407 forms at or near the interface of the channel layer 406 and the polarization layer 408.

The digital p-type doped layer 410 on the polarization layer 408 may include a III-N material (e.g., gallium nitride (GaN)) with alternating layers including and not including p-type dopants (e.g., magnesium or beryllium), forming a heterostructure superlattice of doped and undoped III-N material (e.g., p-GaN and undoped GaN (u-GaN)). For instance, referring to FIG. 4B, the digital p-type doped layer 410 includes a set of alternating sub-layers of p-GaN and u-GaN. During the formation of the digital p-type doped layer 410, the flow of the p-type dopant (e.g., Mg or Be) may be turned on and off to create the alternating sub-layer structure shown. The number of sub-layers in the digital p-type doped layer 410 may be of any suitable number, e.g., between 2 sub-layers (i.e., one p-GaN sub-layer and one GaN sub-layer) and 12 sub-layers (i.e., six p-GaN sub-layers and six GaN sub-layers). In some embodiments, carbon, iron, or beryllium can be used as additional dopants to create a barrier for improved sub-channel leakage. The digital p-type doped layer 410 may deplete the 2 DEG 407, causing the HEMT device 400 to function as an enhancement mode (e-mode) device rather than a depletion mode (d-mode) device.

The gate contact 416 may be formed on or above—and in contact with—the the digital p-type doped layer 410, and may include an electrically conductive material, such as a metal. The passivation layer 414 is formed on or above the polarization layer 408 and around the digital p-type doped layer 410. The passivation layer 414 may include a dielectric material such as silicon dioxide ($SiO_2$) or silicon nitride (SiN) and may passivate the surface of the polarization layer 408 (e.g., to protect it from contamination).

Figure 5:
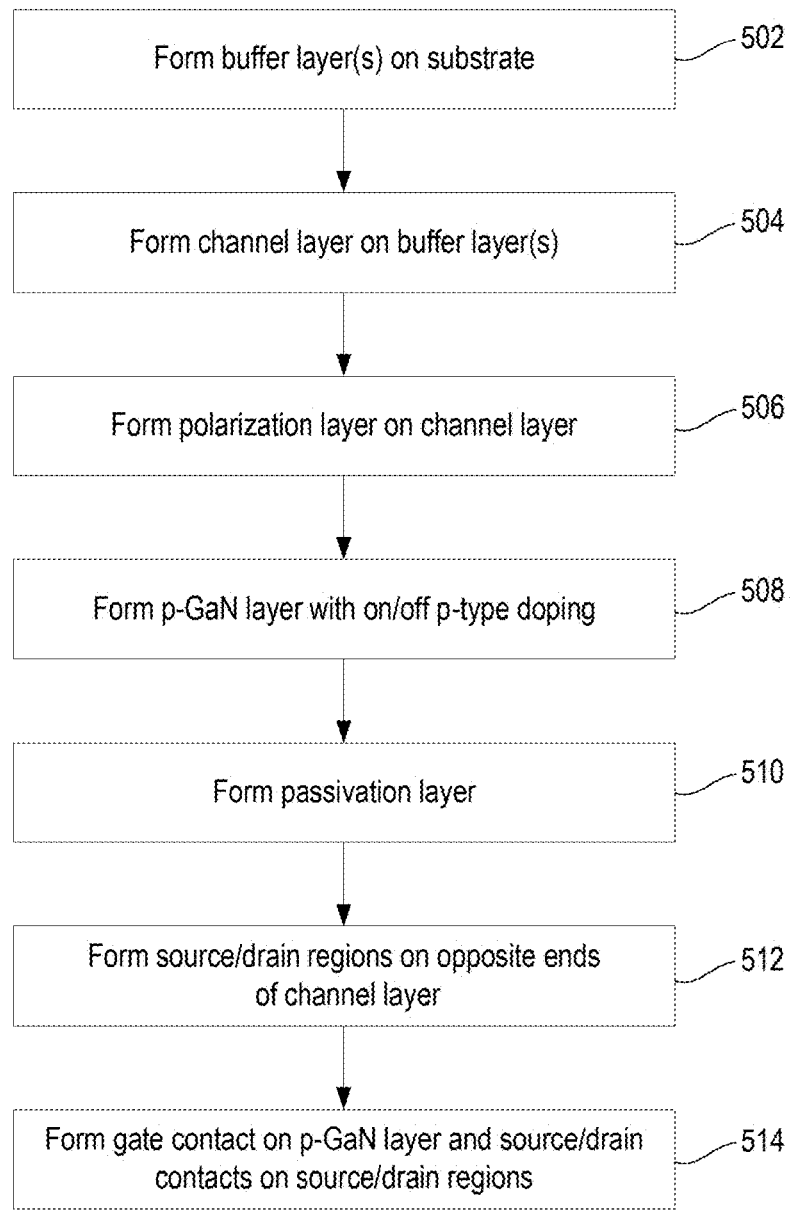
FIG. 5 illustrates a flow diagram of an example process for fabricating a GaN-based high-electron-mobility transistor (HEMT) device with a digital doped p-GaN gate structure in accordance with embodiments of the present disclosure.

FIG. 5 illustrates a flow diagram of an example process 500 for fabricating a GaN-based high-electron-mobility transistor (HEMT) device with a digital doped p-GaN gate structure in accordance with embodiments of the present disclosure. The operations of the process 500 may be performed using any suitable semiconductor fabrication techniques. For example, where not otherwise mentioned below, film deposition—such as depositing layers, filling portions of layers (e.g., removed portions), and filling via openings—may be performed using any suitable deposition techniques, including, for example, chemical vapor deposition (CVD), metalorganic chemical vapor deposition (MOCVD), molecular beam epitaxy (MBE) atomic layer deposition (ALD), and/or physical vapor deposition (PVD). Moreover, patterning and removal—such as interconnect patterning, forming via openings, and shaping—may be performed using any suitable techniques, such as lithography-based patterning/masking and/or etching. Furthermore, additional, fewer, or other operations may be incorporated into the process 500 to fabricate a GaN-based HEMT device in accordance with embodiments of the present disclosure.

At 502, one or more buffer layers (e.g., 404) are formed on a substrate (e.g., 402). In some embodiments, the substrate may be formed from a material that includes silicon (Si), and the buffer layer may be formed from a group III-nitride (III-N) material. The III-N material may include aluminum (Al), gallium (Ga), and/or nitrogen (N), such as aluminum gallium nitride (AlGaN), among other examples.

At 504, a channel layer (e.g., 406) is formed on the buffer layers. In some embodiments, the channel layer may be formed from a III-N material. The III-N material may include gallium (Ga) and/or nitrogen (N), such as gallium nitride (GaN), among other examples.

At 506, a polarization layer (e.g., 408) is formed on the channel layer. In some embodiments, the polarization layer may be formed from a III-N material. The III-N material may include aluminum (Al), gallium (Ga), indium (In), and/or nitrogen (N), such as aluminum gallium nitride (AlGaN) or indium aluminum nitride (InAlN), among other examples. The formation of the polarization layer on the channel layer may form a two-dimensional electron gas (2 DEG) (e.g., 407) at or near the interface of the channel layer and the polarization layer. The polarization layer may be formed, in certain embodiments, using chemical vapor deposition techniques (e.g., MOCVD).

At 510, a digital p-type doped layer (e.g., 410) is formed on the polarization layer. In some embodiments, the digital p-type doped layer 510 may be formed from a III-N material, which may include aluminum (Al), gallium (Ga), and/or nitrogen (N), such as gallium nitride (GaN) or aluminum nitride (AlN), along with a p-type dopant, which may include magnesium or beryllium, among other examples. In particular, as described above, during the formation of the digital p-type doped layer, the flow of the p-type dopant (e.g., Mg or Be) added to the III-N material may be turned on and off periodically or otherwise, causing the formation of a number of p-doped and undoped sub-layers as shown in FIG. 4B. The digital p-type doped layer may be formed, in certain embodiments, using chemical vapor deposition techniques (e.g., MOCVD).

At 512, a passivation layer (e.g., 414) is formed on the polarization layer. In some embodiments, the passivation layer may be formed from a material that includes silicon (Si), oxygen (O), and/or nitrogen (N), such as silicon dioxide ($SiO_2$) or silicon nitride (SiN), among other examples.

At 514, source/drain regions (e.g., 412) are formed on opposite ends of the channel layer. For example, a first source/drain region may be formed adjacent to one end of the channel layer, and a second source/drain region may be formed adjacent to another (e.g., opposite) end of the channel layer (e.g., as shown in FIG. 4) to couple the respective source/drain regions via the channel layer. In some embodiments, the source/drain regions may be formed from a material that includes indium (In), gallium (Ga), and/or nitrogen (N), such as indium gallium nitride (e.g., N+ $In_xGa_{1-x}N$, where x is between 0 and 0.3 and the dopant is Si), among other examples.

At 516, a gate contact (e.g., 116) is formed on the p-GaN layer and source/drain contacts (e.g., 118) are formed on the source/drain regions. In some embodiments, the gate contact and source/drain contacts may be formed from an electrically conductive material such as a metal.

Figure 6:
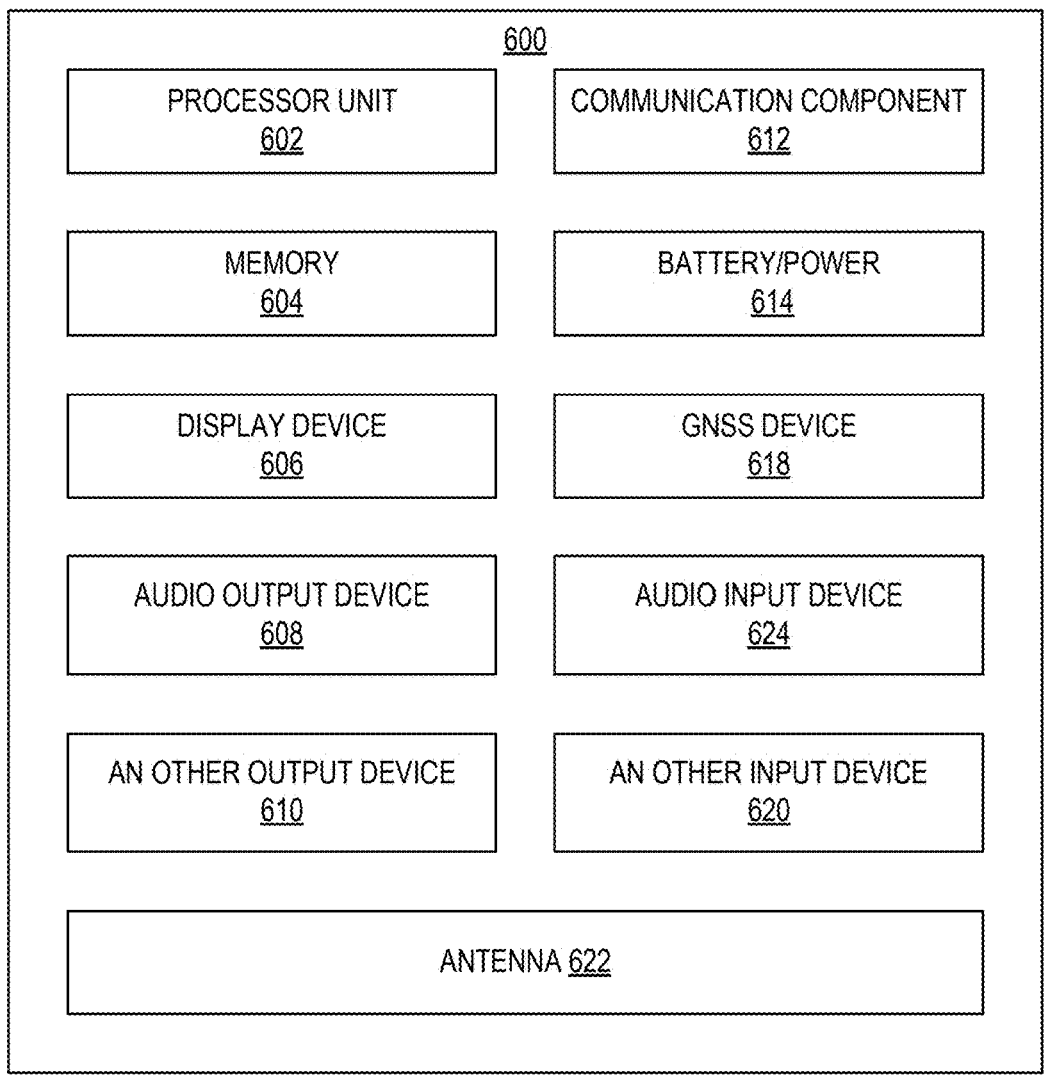
FIG. 6 illustrates a block diagram of an example electrical device that may include one or more embodiments of the disclosure.

FIG. 6 illustrates a block diagram of an example electrical device 600 that may include one or more of the embodiments disclosed herein. For example, any suitable ones of the components of the electrical device 600—such as processor units 602, memory 604, communication components 612 (e.g., network interface controllers, RF front-end circuits)—may include one or more of the group III-nitride (III-N) transistors described herein (e.g., GaN-based HEMT devices fabricated using a $Cp_2Mg$ pre-flow stage as described above). A number of components are illustrated in FIG. 6 as included in the electrical device 600, but any one or more of these components may be omitted or duplicated, as suitable for the application. In some embodiments, some or all of the components included in the electrical device 600 may be attached to one or more motherboards mainboards, or system boards. In some embodiments, one or more of these components are fabricated onto a single system-on-a-chip (SoC) die.

Additionally, in various embodiments, the electrical device 600 may not include one or more of the components illustrated in FIG. 6, but the electrical device 600 may include interface circuitry for coupling to the one or more components. For example, the electrical device 600 may not include a display device 606, but may include display device interface circuitry (e.g., a connector and driver circuitry) to which a display device 606 may be coupled. In another set of examples, the electrical device 600 may not include an audio input device 624 or an audio output device 608, but may include audio input or output device interface circuitry (e.g., connectors and supporting circuitry) to which an audio input device 624 or audio output device 608 may be coupled.

The electrical device 600 may include one or more processor units 602 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 602 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 600 may include a memory 604, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 604 may include memory that is located on the same integrated circuit die as the processor unit 602. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 600 can comprise one or more processor units 602 that are heterogeneous or asymmetric to another processor unit 602 in the electrical device 600. There can be a variety of differences between the processing units 602 in a system in terms of a spectrum of metrics of merit including architectural, micro-architectural, thermal, power consumption characteristics, and the like. These differences can effectively manifest themselves as asymmetry and heterogeneity among the processor units 602 in the electrical device 600.

In some embodiments, the electrical device 600 may include a communication component 612 (e.g., one or more communication components). For example, the communication component 612 can manage wireless communications for the transfer of data to and from the electrical device 600. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 612 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 612 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 612 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 612 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 612 may operate in accordance with other wireless protocols in other embodiments. In some embodiments, the communication component 612 may include a radio-frequency (RF) front-end circuit. The electrical device 600 may include an antenna 622 to facilitate wireless communications and/or to receive other wireless communications (such as AM or FM radio transmissions).

In some embodiments, the communication component 612 may manage wired communications, such as electrical, optical, or any other suitable communication protocols (e.g., IEEE 802.3 Ethernet standards). As noted above, the communication component 612 may include multiple communication components. For instance, a first communication component 612 may be dedicated to shorter-range wireless communications such as Wi-Fi or Bluetooth, and a second communication component 612 may be dedicated to longer-range wireless communications such as global positioning system (GPS), EDGE, GPRS, CDMA, WiMAX, LTE, EV-DO, or others. In some embodiments, a first communication component 612 may be dedicated to wireless communications, and a second communication component 612 may be dedicated to wired communications. In some embodiments, the communication component 612 may include a network interface controller.

The electrical device 600 may include battery/power circuitry 614. The battery/power circuitry 614 may include one or more energy storage devices (e.g., batteries or capacitors) and/or circuitry for coupling components of the electrical device 600 to an energy source separate from the electrical device 600 (e.g., AC line power).

The electrical device 600 may include a display device 606 (or corresponding interface circuitry, as discussed above). The display device 606 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 600 may include an audio output device 608 (or corresponding interface circuitry, as discussed above). The audio output device 608 may include any embedded or wired or wirelessly connected external device that generates an audible indicator, such speakers, headsets, or earbuds.

The electrical device 600 may include an audio input device 624 (or corresponding interface circuitry, as discussed above). The audio input device 624 may include any embedded or wired or wirelessly connected device that generates a signal representative of a sound, such as microphones, microphone arrays, or digital instruments (e.g., instruments having a musical instrument digital interface (MIDI) output). The electrical device 600 may include a Global Navigation Satellite System (GNSS) device 618 (or corresponding interface circuitry, as discussed above), such as a Global Positioning System (GPS) device. The GNSS device 618 may be in communication with a satellite-based system and may determine a geolocation of the electrical device 600 based on information received from one or more GNSS satellites, as known in the art.

The electrical device 600 may include other output device(s) 610 (or corresponding interface circuitry, as discussed above). Examples of the other output device(s) 610 may include an audio codec, a video codec, a printer, a wired or wireless transmitter for providing information to other devices, or an additional storage device.

The electrical device 600 may include other input device(s) 620 (or corresponding interface circuitry, as discussed above). Examples of the other input device(s) 620 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 600 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 600 may be any other electronic device that processes data. In some embodiments, the electrical device 600 may comprise multiple discrete physical components. Given the range of devices that the electrical device 600 can be manifested as in various embodiments, in some embodiments, the electrical device 600 can be referred to as a computing device or a computing system.

Figure 7:
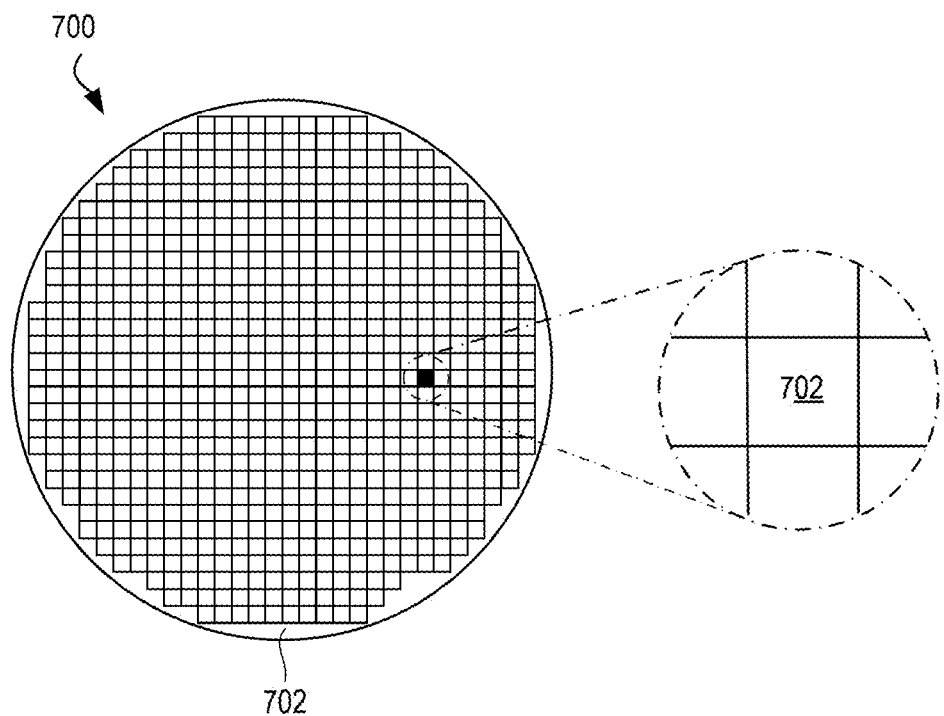
FIG. 7 is a top view of a wafer and dies that may be included in a microelectronic assembly, in accordance with any of the embodiments disclosed herein.

FIG. 7 is a top view of a wafer 700 and dies 702 that may be included in any of the embodiments disclosed herein. The wafer 700 may be composed of semiconductor material and may include one or more dies 702 having integrated circuit structures formed on a surface of the wafer 700. The individual dies 702 may be a repeating unit of an integrated circuit product that includes any suitable integrated circuit. After the fabrication of the semiconductor product is complete, the wafer 700 may undergo a singulation process in which the dies 702 are separated from one another to provide discrete "chips" of the integrated circuit product. The die 702 may be any of the dies disclosed herein. The die 702 may include one or more transistors (e.g., a GaN-based HEMT device, e.g., 100, fabricated using a $Cp_2Mg$ pre-flow stage as described with respect to FIG. 2 and/or the transistors 840 of FIG. 8), supporting circuitry to route electrical signals to the transistors, passive components (e.g., signal traces, resistors, capacitors, or inductors), and/or any other integrated circuit components. In some embodiments, the wafer 700 or the die 702 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 702. For example, a memory array formed by multiple memory devices may be formed on a same die 702 as a processor unit (e.g., the processor unit 602 of FIG. 6) or other logic that is configured to store information in the memory devices or execute instructions stored in the memory array. Various ones of the microelectronic assemblies disclosed herein may be manufactured using a die-to-wafer assembly technique in which some dies are attached to a wafer 700 that include others of the dies, and the wafer 700 is subsequently singulated.

Figure 8:
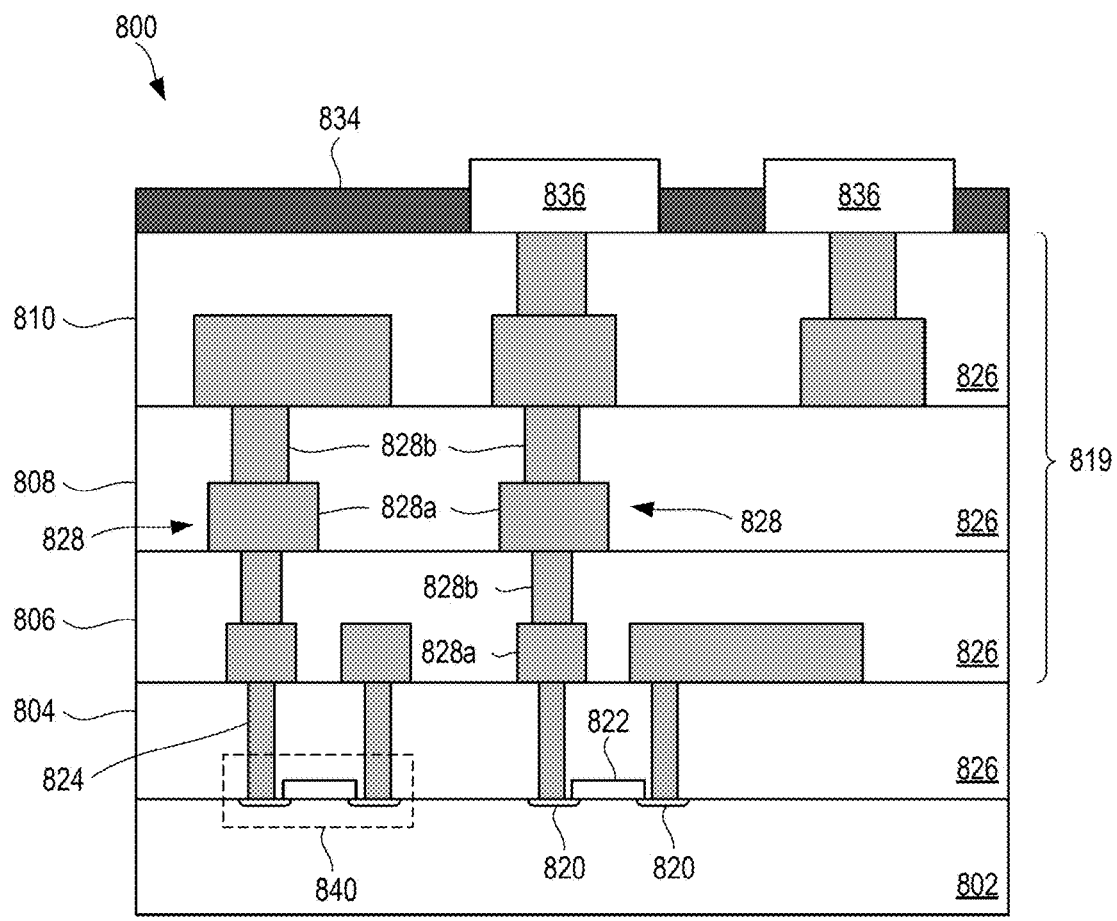
FIG. 8 is a cross-sectional side view of an integrated circuit device that may be included in a microelectronic assembly, in accordance with any of the embodiments disclosed herein.

FIG. 8 is a cross-sectional side view of an integrated circuit device 800 that may be included in any of the embodiments disclosed herein (e.g., in any of the dies). One or more of the integrated circuit devices 800 may be included in one or more dies 702 (FIG. 7). The integrated circuit device 800 may be formed on a die substrate 802 (e.g., the wafer 700 of FIG. 7) and may be included in a die (e.g., the die 702 of FIG. 7). The die substrate 802 may be a semiconductor substrate composed of semiconductor material systems including, for example, n-type or p-type materials systems (or a combination of both). The die substrate 802 may include, for example, a crystalline substrate formed using a bulk silicon or a silicon-on-insulator (SOI) substructure. In some embodiments, the die substrate 802 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 802. Although a few examples of materials from which the die substrate 802 may be formed are described here, any material that may serve as a foundation for an integrated circuit device 800 may be used. The die substrate 802 may be part of a singulated die (e.g., the dies 702 of FIG. 7) or a wafer (e.g., the wafer 700 of FIG. 7).

The integrated circuit device 800 may include one or more device layers 804 disposed on the die substrate 802. The device layer 804 may include features of one or more transistors 840 (e.g., metal oxide semiconductor field-effect transistors (MOSFETs)) formed on the die substrate 802. The transistors 840 may include, for example, one or more source and/or drain (S/D) regions 820, a gate 822 to control current flow between the S/D regions 820, and one or more S/D contacts 824 to route electrical signals to/from the S/D regions 820. The transistors 840 may include additional features not depicted for the sake of clarity, such as device isolation regions, gate contacts, and the like. The transistors 840 are not limited to the type and configuration depicted in FIG. 8 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon, nanosheet, or nanowire transistors.

Returning to FIG. 8, a transistor 840 may include a gate 822 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 840 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 840 along the source-channel-drain direction, the gate electrode may consist of a U-shaped structure that includes a bottom portion substantially parallel to the surface of the die substrate 802 and two sidewall portions that are substantially perpendicular to the top surface of the die substrate 802. In other embodiments, at least one of the metal layers that form the gate electrode may simply be a planar layer that is substantially parallel to the top surface of the die substrate 802 and does not include sidewall portions substantially perpendicular to the top surface of the die substrate 802. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 820 may be formed within the die substrate 802 adjacent to the gate 822 of individual transistors 840. The S/D regions 820 may be formed using an implantation/diffusion process or an etching/deposition process, for example. In the former process, dopants such as boron, aluminum, antimony, phosphorous, or arsenic may be ion-implanted into the die substrate 802 to form the S/D regions 820. An annealing process that activates the dopants and causes them to diffuse farther into the die substrate 802 may follow the ion-implantation process. In the latter process, the die substrate 802 may first be etched to form recesses at the locations of the S/D regions 820. An epitaxial deposition process may then be carried out to fill the recesses with material that is used to fabricate the S/D regions 820. In some implementations, the S/D regions 820 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 820 may be formed using one or more alternate semiconductor materials such as germanium or a group III-V material or alloy. In further embodiments, one or more layers of metal and/or metal alloys may be used to form the S/D regions 820.

Electrical signals, such as power and/or input/output (I/O) signals, may be routed to and/or from the devices (e.g., transistors 840) of the device layer 804 through one or more interconnect layers disposed on the device layer 804 (illustrated in FIG. 8 as interconnect layers 806-810). For example, electrically conductive features of the device layer 804 (e.g., the gate 822 and the S/D contacts 824) may be electrically coupled with the interconnect structures 828 of the interconnect layers 806-810. The one or more interconnect layers 806-810 may form a metallization stack (also referred to as an "ILD stack") 819 of the integrated circuit device 800.

The interconnect structures 828 may be arranged within the interconnect layers 806-810 to route electrical signals according to a wide variety of designs; in particular, the arrangement is not limited to the particular configuration of interconnect structures 828 depicted in FIG. 8. Although a particular number of interconnect layers 806-810 is depicted in FIG. 8, embodiments of the present disclosure include integrated circuit devices having more or fewer interconnect layers than depicted.

In some embodiments, the interconnect structures 828 may include lines 828a and/or vias 828b filled with an electrically conductive material such as a metal. The lines 828a may be arranged to route electrical signals in a direction of a plane that is substantially parallel with a surface of the die substrate 802 upon which the device layer 804 is formed. For example, the lines 828a may route electrical signals in a direction in and out of the page and/or in a direction across the page from the perspective of FIG. 8. The vias 828b may be arranged to route electrical signals in a direction of a plane that is substantially perpendicular to the surface of the die substrate 802 upon which the device layer 804 is formed. In some embodiments, the vias 828b may electrically couple lines 828a of different interconnect layers 806-810 together.

The interconnect layers 806-810 may include a dielectric material 826 disposed between the interconnect structures 828, as shown in FIG. 8. In some embodiments, dielectric material 826 disposed between the interconnect structures 828 in different ones of the interconnect layers 806-810 may have different compositions; in other embodiments, the composition of the dielectric material 826 between different interconnect layers 806-810 may be the same. The device layer 804 may include a dielectric material 826 disposed between the transistors 840 and a bottom layer of the metallization stack as well. The dielectric material 826 included in the device layer 804 may have a different composition than the dielectric material 826 included in the interconnect layers 806-810; in other embodiments, the composition of the dielectric material 826 in the device layer 804 may be the same as a dielectric material 826 included in any one of the interconnect layers 806-810.

A first interconnect layer 806 (referred to as Metal 1 or "M1") may be formed directly on the device layer 804. In some embodiments, the first interconnect layer 806 may include lines 828a and/or vias 828b, as shown. The lines 828a of the first interconnect layer 806 may be coupled with contacts (e.g., the S/D contacts 824) of the device layer 804. The vias 828b of the first interconnect layer 806 may be coupled with the lines 828a of a second interconnect layer 808.

The second interconnect layer 808 (referred to as Metal 2 or "M2") may be formed directly on the first interconnect layer 806. In some embodiments, the second interconnect layer 808 may include via 828b to couple the lines 828 of the second interconnect layer 808 with the lines 828a of a third interconnect layer 810. Although the lines 828a and the vias 828b are structurally delineated with a line within individual interconnect layers for the sake of clarity, the lines 828a and the vias 828b may be structurally and/or materially contiguous (e.g., simultaneously filled during a dual-damascene process) in some embodiments.

The third interconnect layer 810 (referred to as Metal 3 or "M3") (and additional interconnect layers, as desired) may be formed in succession on the second interconnect layer 808 according to similar techniques and configurations described in connection with the second interconnect layer 808 or the first interconnect layer 806. In some embodiments, the interconnect layers that are "higher up" in the metallization stack 819 in the integrated circuit device 800 (i.e., farther away from the device layer 804) may be thicker that the interconnect layers that are lower in the metallization stack 819, with lines 828a and vias 828b in the higher interconnect layers being thicker than those in the lower interconnect layers.

The integrated circuit device 800 may include a solder resist material 834 (e.g., polyimide or similar material) and one or more conductive contacts 836 formed on the interconnect layers 806-810. In FIG. 8, the conductive contacts 836 are illustrated as taking the form of bond pads. The conductive contacts 836 may be electrically coupled with the interconnect structures 828 and configured to route the electrical signals of the transistor(s) 840 to external devices. For example, solder bonds may be formed on the one or more conductive contacts 836 to mechanically and/or electrically couple an integrated circuit die including the integrated circuit device 800 with another component (e.g., a printed circuit board). The integrated circuit device 800 may include additional or alternate structures to route the electrical signals from the interconnect layers 806-810; for example, the conductive contacts 836 may include other analogous features (e.g., posts) that route the electrical signals to external components. The conductive contacts 836 may serve as any of the conductive contacts described throughout this disclosure.

In some embodiments in which the integrated circuit device 800 is a double-sided die, the integrated circuit device 800 may include another metallization stack (not shown) on the opposite side of the device layer(s) 804. This metallization stack may include multiple interconnect layers as discussed above with reference to the interconnect layers 806-810, to provide conductive pathways (e.g., including conductive lines and vias) between the device layer(s) 804 and additional conductive contacts (not shown) on the opposite side of the integrated circuit device 800 from the conductive contacts 836. These additional conductive contacts may serve as any of the conductive contacts described throughout this disclosure.

In other embodiments in which the integrated circuit device 800 is a double-sided die, the integrated circuit device 800 may include one or more through silicon vias (TSVs) through the die substrate 802; these TSVs may make contact with the device layer(s) 804, and may provide conductive pathways between the device layer(s) 804 and additional conductive contacts (not shown) on the opposite side of the integrated circuit device 800 from the conductive contacts 836. These additional conductive contacts may serve as any of the conductive contacts described throughout this disclosure. In some embodiments, TSVs extending through the substrate can be used for routing power and ground signals from conductive contacts on the opposite side of the integrated circuit device 800 from the conductive contacts 836 to the transistors 840 and any other components integrated into the die 800, and the metallization stack 819 can be used to route I/O signals from the conductive contacts 836 to transistors 840 and any other components integrated into the die 800.

Multiple integrated circuit devices 800 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 9:
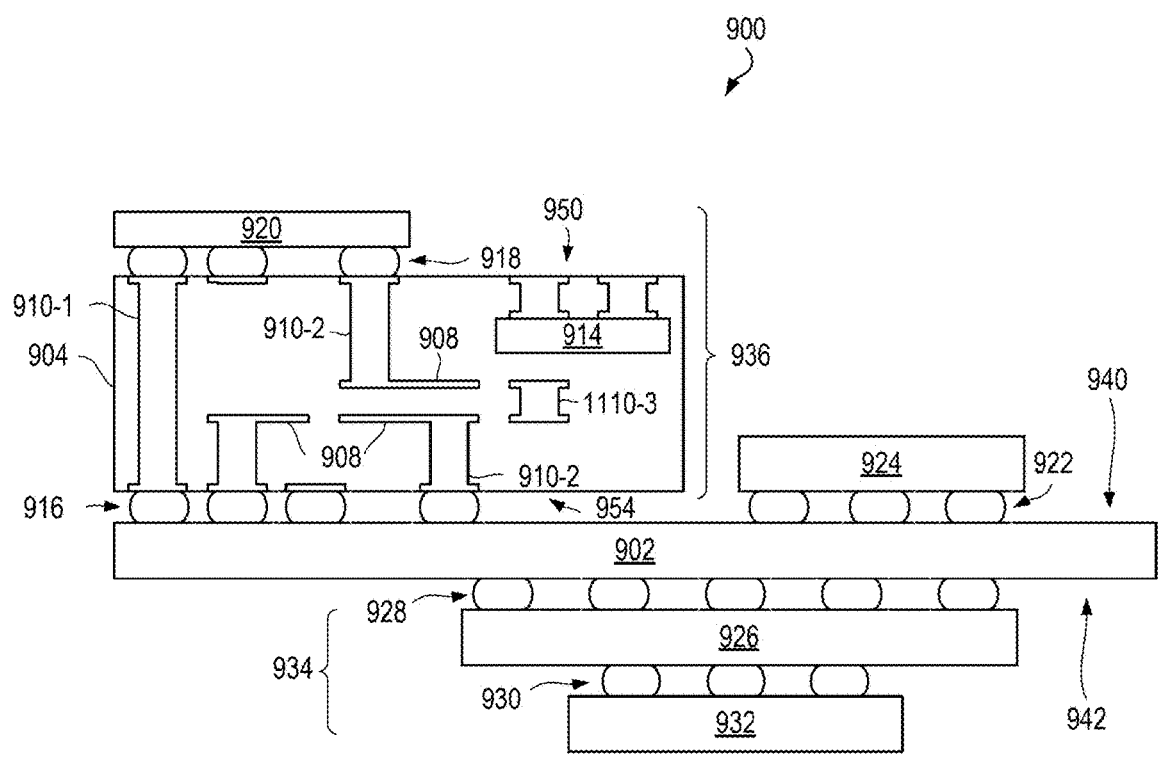
FIG. 9 is a cross-sectional side view of an integrated circuit device assembly that may include a microelectronic assembly, in accordance with any of the embodiments disclosed herein.

FIG. 9 is a cross-sectional side view of an integrated circuit device assembly 900 that may include any of the embodiments disclosed herein. In some embodiments, the integrated circuit device assembly 900 may be a microelectronic assembly. The integrated circuit device assembly 900 includes a number of components disposed on a circuit board 902 (which may be a motherboard, system board, mainboard, etc.). The integrated circuit device assembly 900 includes components disposed on a first face 940 of the circuit board 902 and an opposing second face 942 of the circuit board 902; generally, components may be disposed on one or both faces 940 and 942. Any of the integrated circuit components discussed below with reference to the integrated circuit device assembly 900 may take the form of any suitable ones of the embodiments of the microelectronic assemblies 100 disclosed herein.

In some embodiments, the circuit board 902 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 902. In other embodiments, the circuit board 902 may be a non-PCB substrate. The integrated circuit device assembly 900 illustrated in FIG. 9 includes a package-on-interposer structure 936 coupled to the first face 940 of the circuit board 902 by coupling components 916. The coupling components 916 may electrically and mechanically couple the package-on-interposer structure 936 to the circuit board 902, and may include solder balls (as shown in FIG. 9), pins (e.g., as part of a pin grid array (PGA), contacts (e.g., as part of a land grid array (LGA)), male and female portions of a socket, an adhesive, an underfill material, and/or any other suitable electrical and/or mechanical coupling structure. The coupling components 916 may serve as the coupling components illustrated or described for any of the substrate assembly or substrate assembly components described herein, as appropriate.

The package-on-interposer structure 936 may include an integrated circuit component 920 coupled to an interposer 904 by coupling components 918. The coupling components 918 may take any suitable form for the application, such as the forms discussed above with reference to the coupling components 916. Although a single integrated circuit component 920 is shown in FIG. 9, multiple integrated circuit components may be coupled to the interposer 904; indeed, additional interposers may be coupled to the interposer 904. The interposer 904 may provide an intervening substrate used to bridge the circuit board 902 and the integrated circuit component 920.

The integrated circuit component 920 may be a packaged or unpacked integrated circuit product that includes one or more integrated circuit dies (e.g., the die 702 of FIG. 7, the integrated circuit device 800 of FIG. 8) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 920, a single monolithic integrated circuit die comprises solder bumps attached to contacts on the die. The solder bumps allow the die to be directly attached to the interposer 904. The integrated circuit component 920 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 920 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 920 comprises multiple integrated circuit dies, they dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 920 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 904 may spread connections to a wider pitch or reroute a connection to a different connection. For example, the interposer 904 may couple the integrated circuit component 920 to a set of ball grid array (BGA) conductive contacts of the coupling components 916 for coupling to the circuit board 902. In the embodiment illustrated in FIG. 9, the integrated circuit component 920 and the circuit board 902 are attached to opposing sides of the interposer 904; in other embodiments, the integrated circuit component 920 and the circuit board 902 may be attached to a same side of the interposer 904. In some embodiments, three or more components may be interconnected by way of the interposer 904.

In some embodiments, the interposer 904 may be formed as a PCB, including multiple metal layers separated from one another by layers of dielectric material and interconnected by electrically conductive vias. In some embodiments, the interposer 904 may be formed of an epoxy resin, a fiberglass-reinforced epoxy resin, an epoxy resin with inorganic fillers, a ceramic material, or a polymer material such as polyimide. In some embodiments, the interposer 904 may be formed of alternate rigid or flexible materials that may include the same materials described above for use in a semiconductor substrate, such as silicon, germanium, and other group III-V and group IV materials. The interposer 904 may include metal interconnects 908 and vias 910, including but not limited to through hole vias 910-1 (that extend from a first face 950 of the interposer 904 to a second face 954 of the interposer 904), blind vias 910-2 (that extend from the first or second faces 950 or 954 of the interposer 904 to an internal metal layer), and buried vias 910-3 (that connect internal metal layers).

In some embodiments, the interposer 904 can comprise a silicon interposer. Through silicon vias (TSV) extending through the silicon interposer can connect connections on a first face of a silicon interposer to an opposing second face of the silicon interposer. In some embodiments, an interposer 904 comprising a silicon interposer can further comprise one or more routing layers to route connections on a first face of the interposer 904 to an opposing second face of the interposer 904.

The interposer 904 may further include embedded devices 914, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 904. The package-on-interposer structure 936 may take the form of any of the package-on-interposer structures known in the art. In embodiments where the interposer is a non-printed circuit board The integrated circuit device assembly 900 may include an integrated circuit component 924 coupled to the first face 940 of the circuit board 902 by coupling components 922. The coupling components 922 may take the form of any of the embodiments discussed above with reference to the coupling components 916, and the integrated circuit component 924 may take the form of any of the embodiments discussed above with reference to the integrated circuit component 920.

The integrated circuit device assembly 900 illustrated in FIG. 9 includes a package-on-package structure 934 coupled to the second face 942 of the circuit board 902 by coupling components 928. The package-on-package structure 934 may include an integrated circuit component 926 and an integrated circuit component 932 coupled together by coupling components 930 such that the integrated circuit component 926 is disposed between the circuit board 902 and the integrated circuit component 932. The coupling components 928 and 930 may take the form of any of the embodiments of the coupling components 916 discussed above, and the integrated circuit components 926 and 932 may take the form of any of the embodiments of the integrated circuit component 920 discussed above. The package-on-package structure 934 may be configured in accordance with any of the package-on-package structures known in the art.

Illustrative examples of the technologies described throughout this disclosure are provided below. Embodiments of these technologies may include any one or more, and any combination of, the examples described below. In some embodiments, at least one of the systems or components set forth in one or more of the preceding figures may be configured to perform one or more operations, techniques, processes, and/or methods as set forth in the following examples.

Example 1 includes an apparatus comprising: a substrate; a buffer layer on the substrate, the buffer layer comprising a first group III-nitride (III-N) material; a channel layer on the buffer layer, the channel layer comprising a second III-N material; one or more polarization layers on the channel layer, the one or more polarization layers comprising a third III-N material comprising a first group III constituent and a second group III constituent; a plurality of p-type doped layers on the one or more polarization layers, each of the plurality of p-type doped layers comprising a first p-type dopant and the third III-N material, wherein each successive layer of the first p-type doped layers has a lower proportion of the first group III constituent to the second group III constituent relative to a layer below it; a p-type doped layer on the plurality of p-type doped layers comprising a second p-type dopant and a fourth III-N material; and a source region adjacent one end of the channel layer; and a drain region adjacent another end of the channel layer.

Example 2 includes the subject matter of Example 1, wherein the one or more polarization layers comprise a plurality of polarization layers, each successive layer of the polarization layers having a lower proportion of the first group III constituent to the second group III constituent than a layer below it.

Example 3 includes the subject matter of Example 1 or 2, wherein: the one or more polarization layers comprise: a first polarization layer on the channel layer, wherein the first group III constituent of the first polarization layer is in a first proportion to the second group III constituent of the first polarization layer; and a second polarization layer on the first polarization layer, wherein the first group III constituent of the second polarization layer is in a second proportion to the second group III constituent of the second polarization layer; the plurality of p-type doped layers comprise: a first p-type doped layer on the second polarization layer, wherein the first group III constituent of the first p-type doped layer is in a third proportion to the second group III constituent of the first p-type doped layer; a second p-type doped layer on the first p-type doped layer, wherein the first group III constituent of the second p-type doped layer is in a fourth proportion to the second group III constituent of the second p-type doped layer; the fourth proportion is lower than the third proportion; the third proportion is lower than the second proportion; and the second proportion is lower than the first proportion.

Example 4 includes the subject matter of any one of Examples 1-3, wherein the first III-N material comprises aluminum, gallium, and nitrogen.

Example 5 includes the subject matter of any one of Examples 1-4, wherein the second III-N material comprises gallium, and nitrogen.

Example 6 includes the subject matter of any one of Examples 1-5, wherein the third III-N material comprises aluminum, gallium, and nitrogen or indium, aluminum, and nitrogen.

Example 7 includes the subject matter of any one of Examples 1-6, wherein the fourth III-N material comprises gallium and nitrogen or aluminum and nitrogen.

Example 8 includes the subject matter of any one of Examples 1-7, wherein the first p-type dopant comprises one or more of magnesium and beryllium and the second p-type dopant comprises one or more of magnesium and beryllium.

Example 9 includes the subject matter of any one of Examples 1-8, wherein the source region and the drain region each comprise a fifth III-N material comprising indium, gallium, and nitrogen.

Example 10 includes a method of forming a transistor, comprising: forming a buffer layer on a substrate, the buffer layer comprising a first group III-nitride (III-N) material; forming a channel layer on the buffer layer, the channel layer comprising a second III-N material; forming one or more polarization layers on the channel layer, the polarization layers comprising a third III-N material comprising a first group III constituent and a second group III constituent; forming a plurality of p-type doped layers on the one or more polarization layers, each of the plurality of p-type doped layers comprising a first p-type dopant and the third III-N material, wherein each successive layer of the first p-type doped layers has a lower proportion of the first group III constituent to the second group III constituent relative to a layer below it; forming a p-type doped layer on the plurality of p-type doped layers comprising a second p-type dopant and a fourth III-N material; forming a source region adjacent one end of the channel layer; and forming a drain region adjacent another end of the channel layer.

Example 11 includes the subject matter of Example 10, wherein forming the one or more polarization layers comprises forming a plurality of polarization layers, each successive layer of the polarization layers having a lower proportion of the first group III constituent to the second group III constituent than a layer below it.

Example 12 includes the subject matter of Example 10 or 11, wherein: forming the one or more polarization layers comprises: forming a first polarization layer on the channel layer, wherein the first group III constituent of the first polarization layer is in a first proportion to the second group III constituent of the first polarization layer; and forming a second polarization layer on the first polarization layer, wherein the first group III constituent of the second polarization layer is in a second proportion to the second group III constituent of the second polarization layer, the second proportion lower than the first proportion; forming the plurality of p-type doped layers comprises: forming a first p-type doped layer on the second polarization layer, wherein the first group III constituent of the first p-type doped layer is in a third proportion to the second group III constituent of the first p-type doped layer, the third proportion lower than the second proportion; forming a second p-type doped layer on the first p-type doped layer, wherein the first group III constituent of the second p-type doped layer is in a fourth proportion to the second group III constituent of the second p-type doped layer, the fourth proportion lower than the third proportion.

Example 13 includes the subject matter of any one of Examples 10-12, wherein: the third III-N material comprises aluminum, gallium, and nitrogen or indium, aluminum, and nitrogen; the fourth III-N material comprises gallium and nitrogen or aluminum and nitrogen; the first p-type dopant comprises magnesium or beryllium; and the second p-type dopant comprises magnesium or beryllium.

Example 14 includes the subject matter of any one of Examples 10-13, wherein: the first III-N material comprises aluminum, gallium, and nitrogen; and the second III-N material comprises gallium, and nitrogen.

Example 15 includes the subject matter of any one of Examples 10-13, wherein the source region and drain region are each formed using a fifth III-N material comprising indium, gallium, and nitrogen.

Example 16 includes a product formed by the process of any one of Examples 10-15.

Example 17 includes an apparatus comprising: a substrate; a buffer layer on the substrate, the buffer layer comprising a first group III-nitride (III-N) material; a channel layer on the buffer layer, the channel layer comprising a second III-N material; one or more polarization layers on the channel layer, the one or more polarization layers comprising a third III-N material comprising a first group III constituent and a second group III constituent; a first p-type doped layer on the one or more polarization layers, the first p-type doped layer comprising a first p-type dopant and the third III-N material, wherein a proportion of the first group III constituent to the second group III constituent is a gradient; a second p-type doped layer on the first p-type doped layer, the second p-type doped layer comprising a second p-type dopant and a fourth III-N material; and a source region adjacent one end of the channel layer; and a drain region adjacent another end of the channel layer.

Example 18 includes the subject matter of Example 17, wherein the one or more polarization layers comprise a plurality of polarization layers, each successive layer of the polarization layers having a lower proportion of the first group III constituent to the second group III constituent than a layer below it.

Example 19 includes the subject matter of Example 17 or 18, wherein: the one or more polarization layers comprise: a first polarization layer on the channel layer, wherein the first group III constituent of the first polarization layer is in a first proportion to the second group III constituent of the first polarization layer; and a second polarization layer on the first polarization layer, wherein the first group III constituent of the second polarization layer is in a second proportion to the second group III constituent of the second polarization layer; the first p-type layer is on the second polarization layer, and the proportion of the first group III constituent to the second group III constituent in the first p-type doped layer is at a third proportion adjacent the second polarization layer and at a fourth proportion adjacent the second p-type doped layer; the fourth proportion is lower than the third proportion; the third proportion is lower than the second proportion; and the second proportion is lower than the first proportion.

Example 20 includes the subject matter of any one of Examples 17-19, wherein the first III-N material comprises aluminum, gallium, and nitrogen.

Example 21 includes the subject matter of any one of Examples 17-20, wherein the second III-N material comprises gallium, and nitrogen.

Example 22 includes the subject matter of any one of Examples 17-21, wherein the third III-N material comprises aluminum, gallium, and nitrogen or indium, aluminum, and nitrogen.

Example 23 includes the subject matter of any one of Examples 17-22, wherein the fourth III-N material comprises gallium and nitrogen or aluminum and nitrogen.

Example 24 includes the subject matter of any one of Examples 17-23, wherein the first p-type dopant comprises one or more of magnesium and beryllium and the second p-type dopant comprises one or more of magnesium and beryllium.

Example 25 includes the subject matter of any one of Examples 17-24, wherein the source region and the drain region each comprise a fifth III-N material comprising indium, gallium, and nitrogen.

Example 26 includes a method of forming a transistor, comprising: forming a buffer layer on a substrate, the buffer layer comprising a first group III-nitride (III-N) material; forming a channel layer on the buffer layer, the channel layer comprising a second III-N material; forming one or more polarization layers on the channel layer, the polarization layers comprising a third III-N material comprising a first group III constituent and a second group III constituent; forming a first p-type doped layer on the one or more polarization layers, the first p-type doped layer comprising a first p-type dopant and the third III-N material, wherein a proportion of the first group III constituent to the second group III constituent is a gradient; forming a second p-type doped layer on the first p-type doped layer, the second p-type doped layer comprising a second p-type dopant and a fourth III-N material; forming a source region adjacent one end of the channel layer; and forming a drain region adjacent another end of the channel layer.

Example 27 includes the subject matter of Example 26, wherein forming the one or more polarization layers comprises forming a plurality of polarization layers, each successive layer of the polarization layers having a lower proportion of the first group III constituent to the second group III constituent than a layer below it.

Example 28 includes the subject matter of Example 26 or 27, wherein: forming the one or more polarization layers comprises: forming a first polarization layer on the channel layer, wherein the first group III constituent of the first polarization layer is in a first proportion to the second group III constituent of the first polarization layer; and forming a second polarization layer on the first polarization layer, wherein the first group III constituent of the second polarization layer is in a second proportion to the second group III constituent of the second polarization layer, the second proportion lower than the first proportion; the first p-type layer is formed on the second polarization layer, and the proportion of the first group III constituent to the second group III constituent in the first p-type doped layer is at a third proportion adjacent the second polarization layer and at a fourth proportion adjacent the second p-type doped layer, the fourth proportion lower than the third proportion and the third proportion lower than the second proportion.

Example 29 includes the subject matter of any one of Examples 26-28, wherein: the third III-N material comprises aluminum, gallium, and nitrogen or indium, aluminum, and nitrogen; the fourth III-N material comprises gallium and nitrogen or aluminum and nitrogen; the first p-type dopant comprises magnesium or beryllium; and the second p-type dopant comprises magnesium or beryllium.

Example 30 includes the subject matter of any one of Examples 26-29, wherein: the first III-N material comprises aluminum, gallium, and nitrogen; and the second III-N material comprises gallium, and nitrogen.

Example 31 includes the subject matter of any one of Examples 26-30, wherein the source region and drain region are each formed using a fifth III-N material comprising indium, gallium, and nitrogen.

Example 32 includes a product formed by the process of any one of Examples 26-31.

Example 33 includes an apparatus comprising: a substrate; a buffer layer on the substrate, the buffer layer comprising a first group III-nitride (III-N) material; a channel layer on the buffer layer, the channel layer comprising a second III-N material; a polarization layer on the channel layer, the polarization layer comprising a third III-N material; a layer on the polarization layer comprising a fourth III-N material and comprising a set of alternating sub-layers of p-type dopant within the fourth III-N material; a source region adjacent one end of the channel layer; and a drain region adjacent another end of the channel layer.

Example 34 includes the subject matter of Example 33, wherein the set of alternating sub-layers of p-type dopant includes 2-12 sub-layers.

Example 35 includes the subject matter of any one of Examples 33-34, wherein the p-type dopant comprises magnesium or beryllium.

Example 36 includes the subject matter of any one of Examples 33-35, wherein the first III-N material comprises aluminum, gallium, and nitrogen.

Example 37 includes the subject matter of any one of Examples 33-36, wherein the second III-N material comprises gallium, and nitrogen.

Example 38 includes the subject matter of any one of Examples 33-37, wherein the third III-N material comprises aluminum, gallium, and nitrogen.

Example 39 includes the subject matter of any one of Examples 33-38, wherein the fourth III-N material comprises gallium and nitrogen, and the p-type dopant comprises magnesium.

Example 40 includes the subject matter of any one of Examples 33-39, wherein the source region and the drain region each comprise a fifth III-N material comprising indium, gallium, and nitrogen.

Example 41 includes a method of forming a transistor, comprising: forming a buffer layer on a substrate, the buffer layer comprising a first group III-nitride (III-N) material; forming a channel layer on the buffer layer, the channel layer comprising a second III-N material; forming a polarization layer on the channel layer, the polarization layer comprising a third III-N material; forming a layer on the polarization layer comprising a fourth III-N material and comprising a set of alternating sub-layers of p-type dopant within the fourth III-N material; forming a source region adjacent one end of the channel layer; and forming a drain region adjacent another end of the channel layer.

Example 42 includes the subject matter of Example 42, wherein the set of alternating sub-layers of p-type dopant includes 2-12 sub-layers.

Example 43 includes the subject matter of Example 42 or 43, wherein the p-type dopant comprises magnesium or beryllium.

Example 44 includes the subject matter of any one of Examples 42-44, wherein: the first III-N material comprises aluminum, gallium, and nitrogen; the second III-N material comprises gallium, and nitrogen; the third III-N material comprises aluminum, gallium, and nitrogen; and the fourth III-N material comprises gallium and nitrogen.

Example 45 includes the subject matter of any one of Examples 42-45, wherein the source region and drain region are each formed using a fifth III-N material comprising indium, gallium, and nitrogen.

Example 46 includes a product formed by the process of any one of Examples 42-46.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

The invention claimed is:

1. An apparatus comprising:
a substrate;
a buffer layer on the substrate, the buffer layer comprising
 a first group III-nitride (III-N) material;
a channel layer on the buffer layer, the channel layer
 comprising a second III-N material;

one or more polarization layers on the channel layer, the one or more polarization layers comprising a third III-N material comprising a first group III constituent and a second group III constituent;

a plurality of p-type doped layers on the one or more polarization layers, each of the plurality of p-type doped layers comprising a first p-type dopant and the third III-N material, wherein each successive layer of the first p-type doped layers has a lower proportion of the first group III constituent to the second group III constituent relative to a layer below it;

a p-type doped layer on the plurality of p-type doped layers comprising a second p-type dopant and a fourth III-N material; and a source region adjacent one end of the channel layer; and a drain region adjacent another end of the channel layer.

2. The apparatus of claim 1, wherein the one or more polarization layers comprise a plurality of polarization layers, each successive layer of the polarization layers having a lower proportion of the first group III constituent to the second group III constituent than a layer below it.

3. The apparatus of claim 1, wherein:
the one or more polarization layers comprise:
a first polarization layer on the channel layer, wherein the first group III constituent of the first polarization layer is in a first proportion to the second group III constituent of the first polarization layer; and
a second polarization layer on the first polarization layer, wherein the first group III constituent of the second polarization layer is in a second proportion to the second group III constituent of the second polarization layer;
the plurality of p-type doped layers comprise:
a first p-type doped layer on the second polarization layer, wherein the first group III constituent of the first p-type doped layer is in a third proportion to the second group III constituent of the first p-type doped layer;
a second p-type doped layer on the first p-type doped layer, wherein the first group III constituent of the second p-type doped layer is in a fourth proportion to the second group III constituent of the second p-type doped layer;
the fourth proportion is lower than the third proportion;
the third proportion is lower than the second proportion; and
the second proportion is lower than the first proportion.

4. The apparatus of claim 1, wherein the first III-N material comprises aluminum, gallium, and nitrogen.

5. The apparatus of claim 1, wherein the second III-N material comprises gallium, and nitrogen.

6. The apparatus of claim 1, wherein the third III-N material comprises aluminum, gallium, and nitrogen or indium, aluminum, and nitrogen.

7. The apparatus of claim 1, wherein the fourth III-N material comprises gallium and nitrogen or aluminum and nitrogen.

8. The apparatus of claim 1, wherein the first p-type dopant comprises one or more of magnesium and beryllium and the second p-type dopant comprises one or more of magnesium and beryllium.

9. The apparatus of claim 1, wherein the source region and the drain region each comprise a fifth III-N material comprising indium, gallium, and nitrogen.

10. An apparatus comprising:
a substrate;
a buffer layer on the substrate, the buffer layer comprising a first group III-nitride (III-N) material;
a channel layer on the buffer layer, the channel layer comprising a second III-N material;
one or more polarization layers on the channel layer, the one or more polarization layers comprising a third III-N material comprising a first group III constituent and a second group III constituent;
a first p-type doped layer on the one or more polarization layers, the first p-type doped layer comprising a first p-type dopant and the third III-N material, wherein a proportion of the first group III constituent to the second group III constituent is a gradient;
a second p-type doped layer on the first p-type doped layer, the second p-type doped layer comprising a second p-type dopant and a fourth III-N material; and
a source region adjacent one end of the channel layer; and
a drain region adjacent another end of the channel layer.

11. The apparatus of claim 10, wherein the one or more polarization layers comprise a plurality of polarization layers, each successive layer of the polarization layers having a lower proportion of the first group III constituent to the second group III constituent than a layer below it.

12. The apparatus of claim 10, wherein:
the one or more polarization layers comprise:
a first polarization layer on the channel layer, wherein the first group III constituent of the first polarization layer is in a first proportion to the second group III constituent of the first polarization layer; and
a second polarization layer on the first polarization layer, wherein the first group III constituent of the second polarization layer is in a second proportion to the second group III constituent of the second polarization layer;
the first p-type layer is on the second polarization layer, and the proportion of the first group III constituent to the second group III constituent in the first p-type doped layer is at a third proportion adjacent the second polarization layer and at a fourth proportion adjacent the second p-type doped layer;
the fourth proportion is lower than the third proportion
the third proportion is lower than the second proportion; and
the second proportion is lower than the first proportion.

13. The apparatus of claim 10, wherein the first III-N material comprises aluminum, gallium, and nitrogen.

14. The apparatus of claim 10, wherein the second III-N material comprises gallium, and nitrogen.

15. The apparatus of claim 10, wherein the third III-N material comprises aluminum, gallium, and nitrogen or indium, aluminum, and nitrogen.

16. The apparatus of claim 10, wherein the fourth III-N material comprises gallium and nitrogen or aluminum and nitrogen.

17. The apparatus of claim 10, wherein the first p-type dopant comprises one or more of magnesium and beryllium and the second p-type dopant comprises one or more of magnesium and beryllium.

18. The apparatus of claim 10, wherein the source region and the drain region each comprise a fifth III-N material comprising indium, gallium, and nitrogen.

19. An apparatus comprising:
a substrate;
a buffer layer on the substrate, the buffer layer comprising a first group III-nitride (III-N) material;

a channel layer on the buffer layer, the channel layer comprising a second III-N material;

one or more polarization layers on the channel layer, the one or more polarization layers comprising a third III-N material comprising a first group III constituent and a second group III constituent;

one or more first p-type doped layers on the one or more polarization layers comprising a first p-type dopant and the third III-N material;

a second p-type doped layer on the one or more first p-type doped layers, the second p-type doped layer comprising a second p-type dopant and a fourth III-N material;

wherein the one or more first p-type doped layers comprise a first proportion of the first group III constituent to the second group III constituent in a region adjacent to the one or more polarization layers and a second proportion of the first group III constituent to the second group III constituent in a region adjacent to the second p-type doped layer, the second proportion lower than the first proportion;

a source region adjacent one end of the channel layer; and a drain region adjacent another end of the channel layer.

20. The apparatus of claim 19, wherein the one or more first p-type doped layers comprise a plurality of layers, each successive layer comprising a lower proportion of the first group III constituent to the second group III constituent relative to a layer below it.

21. The apparatus of claim 19, wherein the one or more first p-type doped layers comprise a gradient of the proportion of the first group III constituent to the second group III constituent.

22. The apparatus of claim 19, wherein the first III-N material comprises aluminum, gallium, and nitrogen.

23. The apparatus of claim 19, wherein the second III-N material comprises gallium, and nitrogen.

24. The apparatus of claim 19, wherein the third III-N material comprises aluminum, gallium, and nitrogen or indium, aluminum, and nitrogen.

25. The apparatus of claim 19, wherein the fourth III-N material comprises gallium and nitrogen or aluminum and nitrogen.

* * * * *